US012720758B2

(12) United States Patent
Kim et al.

(10) Patent No.: US 12,720,758 B2
(45) Date of Patent: Aug. 25, 2026

(54) MEMORY DEVICE

(71) Applicant: Samsung Electronics Co., Ltd., Suwon-si (KR)

(72) Inventors: Hyuncheol Kim, Suwon-si (KR); Yongseok Kim, Suwon-si (KR); Kiheun Lee, Suwon-si (KR); Daewon Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 481 days.

(21) Appl. No.: 18/195,522

(22) Filed: May 10, 2023

(65) Prior Publication Data

US 2023/0371269 A1 Nov. 16, 2023

(30) Foreign Application Priority Data

May 12, 2022 (KR) ........................ 10-2022-0058442

(51) Int. Cl.

| | |
|---|---|
| ***H10B 51/30*** | (2023.01) |
| ***H10B 51/10*** | (2023.01) |
| ***H10D 30/69*** | (2025.01) |
| ***H10D 64/01*** | (2025.01) |
| ***H10D 64/27*** | (2025.01) |
| ***H10D 64/68*** | (2025.01) |

(52) U.S. Cl.

CPC ............ *H10B 51/30* (2023.02); *H10B 51/10* (2023.02); *H10D 30/701* (2025.01); *H10D 64/033* (2025.01); *H10D 64/514* (2025.01); *H10D 64/68* (2025.01); *H10D 64/681* (2025.01); *H10D 64/685* (2025.01); *H10D 64/689* (2025.01)

(58) Field of Classification Search

CPC ...... H10B 51/10; H10B 51/30; H10D 30/701; H10D 64/033; H10D 64/514; H10D 64/515; H10D 64/68; H10D 64/681; H10D 64/685; H10D 64/689

See application file for complete search history.

(56) References Cited

U.S. PATENT DOCUMENTS

| | | | | |
|---|---|---|---|---|
| 2019/0304986 | A1* | 10/2019 | Dong | H10B 51/20 |
| 2020/0066868 | A1 | 2/2020 | Ino et al. | |
| 2020/0176610 | A1 | 6/2020 | Lee et al. | |
| 2020/0211839 | A1 | 7/2020 | Salahuddin et al. | |
| 2021/0028273 | A1 | 1/2021 | Yoon et al. | |
| 2021/0057455 | A1* | 2/2021 | Nishida | H01L 21/02181 |

(Continued)

FOREIGN PATENT DOCUMENTS

| | | | | |
|---|---|---|---|---|
| KR | 10-2020-0078048 A | 7/2020 | | |
| KR | 20210111625 A | 9/2021 | | |
| WO | WO-2022225698 A2 * | 10/2022 | | H10D 64/691 |

*Primary Examiner* — Matthew E Warren

(74) *Attorney, Agent, or Firm* — Wolf, Greenfield & Sacks, P.C.

(57) ABSTRACT

A memory device includes a channel region, a conductive electrode on the channel region, and a data storage structure between the channel region and the conductive electrode. The data storage structure includes a stack structure including two-dimensional material layers and ferroelectric layers stacked alternately and repeatedly in a direction perpendicular to a surface of the channel region. A thickness of each of the ferroelectric layers is greater than a thickness of each of the two-dimensional material layers.

16 Claims, 22 Drawing Sheets

(56) References Cited

U.S. PATENT DOCUMENTS

| | | | | |
|---|---|---|---|---|
| 2021/0098596 | A1* | 4/2021 | Jo | H10D 64/689 |
| 2021/0280720 | A1 | 9/2021 | Lee et al. | |
| 2021/0375928 | A1 | 12/2021 | Wu et al. | |
| 2022/0020862 | A1 | 1/2022 | Zheng et al. | |
| 2022/0028874 | A1 | 1/2022 | Lee et al. | |
| 2023/0123234 | A1* | 4/2023 | Shin | H10B 51/20<br>257/288 |

* cited by examiner

MEMORY DEVICE

CROSS-REFERENCE TO RELATED APPLICATION(S)

This application claims benefit of priority to Korean Patent Application No. 10-2022-0058442 filed on May 12, 2022 in the Korean Intellectual Property Office, the disclosure of which is incorporated herein by reference in its entirety.

TECHNICAL FIELD

The present disclosure relates to a memory device and a method of fabricating the same.

BACKGROUND

Research into novel memories, which may replace DRAM memories and flash memories, has been conducted in recent years. For example, research into a ferroelectric memory as a nonvolatile and high-speed RAM has been conducted.

SUMMARY

Example embodiments provide a memory device having improved reliability or performance.

According to an example embodiment, a memory device includes a channel region, a conductive electrode on the channel region, and a data storage structure between the channel region and the conductive electrode. The data storage structure may include a stack structure including two-dimensional material layers and ferroelectric layers stacked alternately and repeatedly in a direction perpendicular to a surface of the channel region. A thickness of each of the ferroelectric layers may be greater than a thickness of each of the two-dimensional material layers.

According to an example embodiment, a memory device includes a channel region, a conductive electrode facing the channel region, and a data storage structure between the channel region and the conductive electrode. The data storage structure may include a stack structure including stressor layers and ferroelectric layers stacked alternately and repeatedly in a direction perpendicular to a surface of the channel region. A thickness of each of the stressor layers in the direction may be in a range from about 3 angstroms to about 10 angstroms. A thickness of each of the ferroelectric layers in the direction may be in a range from about 10 angstroms to about 200 angstroms.

According to an example embodiment, a memory device includes a channel region, a conductive electrode facing the channel region, and a data storage structure between the channel region and the conductive electrode. The data storage structure may include a stack structure including two-dimensional material layers and data storage layers stacked alternately and repeatedly in a direction perpendicular to a surface of the channel region. A thickness of each of the data storage layers in the direction may be greater than a thickness of each of the two-dimensional material layers in the direction.

BRIEF DESCRIPTION OF THE DRAWINGS

The above and other aspects, features, and advantages of the present disclosure will be more clearly understood from the following detailed description, taken in conjunction with the accompanying drawings.

DETAILED DESCRIPTION

Hereinafter, terms such as "upper," "intermediate," and "lower" may be replaced with other terms, for example, "first," "second," and "third" to describe elements of the present specification. The terms such as "first," "second," and "third" may be used to describe various elements, but the elements may not be restricted by the terms, and "first element" may be referred to as "second element."

Figure 1:
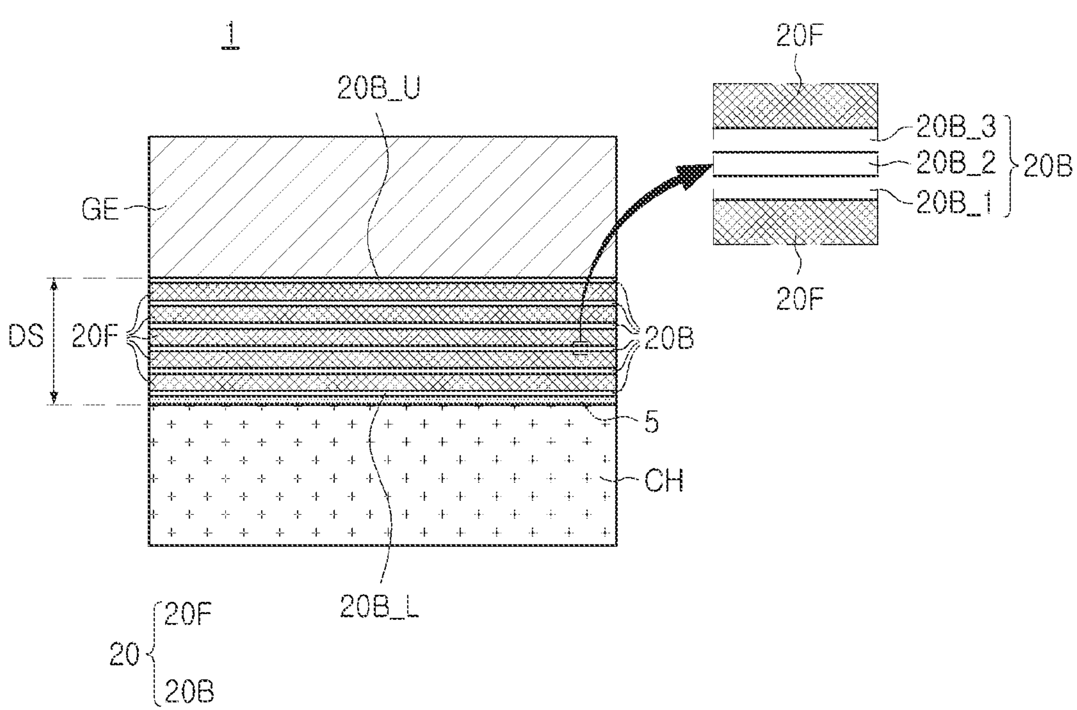
FIG. 1 is a cross-sectional view illustrating a memory device according to an example embodiment.

A memory device according to an example embodiment will be described with reference to FIG. 1. FIG. 1 is a cross-sectional view illustrating a memory device according to an example embodiment.

Referring to FIG. 1, a memory device 1 according to an example embodiment may include a first region CH, a second region GE on the first region CH, and a data storage structure DS between the first region CH and the second region GE. The first region CH may be a channel region. For example, the first region CH may be a semiconductor channel region which may be formed of a semiconductor material. The second region GE may be a conductive electrode. For example, the second region GE may be a gate electrode or a wordline.

Hereinafter, the first region CH will be referred to as a "channel region" and the second region GE will be referred to as a "conductive electrode."

The channel region CH may include a material, which may be used as a channel of a transistor, for example, a semiconductor material. For example, the channel region CH may be formed of a semiconductor material such as silicon. The channel region CH may be formed of single-crystalline silicon or polycrystalline silicon (polysilicon). However, the material of the channel region CH is not limited to a semiconductor material such as silicon, and may be another semiconductor material which may be used as a channel region of a transistor. For example, the channel region CH may include an oxide semiconductor layer which may be used as a channel region of a transistor or a two-dimensional material layer having semiconductor characteristics.

The oxide semiconductor layer may include at least one of indium gallium zinc oxide (IGZO), indium tungsten oxide (IWO), indium tin gallium oxide (ITGO), indium aluminum zinc oxide (IAGO), indium gallium oxide (IGO), indium tin zinc oxide (ITZO), zinc tin oxide (ZTO), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and/or indium gallium silicon oxide (InGaSiO). The two-dimensional material layer having semiconductor characteristics may include at least one of a transition metal dichalcogenide (TMD) material layer and/or a black phosphorous material layer. As used herein, the term "and/or" includes any and all combinations of one or more of the associated listed items.

The conductive electrode GE may include doped polysilicon, a metal, a conductive metal nitride, a metal-semiconductor compound, a conductive metal oxide, a conductive graphene, carbon nanotubes, or combinations thereof. For example, the conductive electrode GE may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotubes, or combinations thereof. However, example embodiments are not limited thereto. The conductive electrode GE may include a single layer or multiple layers of the above-mentioned materials.

The data storage structure DS may include a lower dielectric layer 5 and a stack structure 20 disposed on the lower dielectric layer 5.

The lower dielectric layer 5 may be in contact with the channel region CH.

The lower dielectric layer 5 may include at least one of a silicon oxide, a silicon oxynitride, a silicon nitride, and/or a high-κ dielectric material. The high-κ dielectric material may include a metal oxide or a metal oxynitride. For example, the high-κ dielectric material may be formed of $HfO_2$, HfSiO, HfSiON, HfTaO, HfTiO, HfZrO, $ZrO_2$, $Al_2O_3$, or combinations thereof. However, example embodiments are not limited thereto.

The lower dielectric layer 5 may have a thickness ranging from about 8 angstroms to about 20 angstroms.

The stack structure 20 may include two-dimensional material layers 20B and data storage layers 20F stacked alternately and repeatedly.

The data storage layers 20F may be ferroelectric layers. For example, the data storage layers 20F may include a ferroelectric material including at least one of an Hf-based compound, a Zr-based compound, and/or an Hf—Zr-based compound. For example, the Hf-based compound may be an HfO-based ferroelectric material, the Zr-based compound may include a ZrO-based ferroelectric material, and the Hf—Zr-based compound may include a hafnium zirconium oxide (HZO)-based ferroelectric material. The data storage layers 20F may include a ferroelectric material doped with impurities, for example, at least one of carbon (C), silicon (Si), magnesium (Mg), aluminum (Al), yttrium (Y), nitrogen (N), germanium (Ge) and tin (Sn), gadolinium (Gd), lanthanum (La), scandium (Sc), and/or strontium (Sr). A first material of the data storage layers 20F may be a ferroelectric material in which at least one of $HfO_2$, $ZrO_2$, and HZO is doped with at least one of C, Si, Mg, Al, Y, N, Ge and/or Sn, Gd, La, Sc, and Sr. The data storage layers 20F are not limited to the above-described material types, and may include a material having ferroelectric characteristics to store data. For example, the first material of the data storage layers 20F may be a ferroelectric material including at least one of $BaTiO_3$, $PbTiO_3$, $BiFeO_3$, $SrTiO_3$, $PbMgNdO_3$, $PbMgNbTiO_3$, $PbZrNbTiO_3$, $PbZrTiO_3$, $KNbO_3$, $LiNbO_3$, $KNbO_3$, GeTe, $LiTaO_3$, $KNaNbO_3$, $BaSrTiO_3$, $HF_{0.5}Zr_{0.5}O_2$, $PbZr_xTi_{1-x}O_3(0<x<1)$, $Ba(Sr,Ti)O_3$, $Bi_{4-x}LaxTi_3O_{12}(0<x<1)$, $SrBi_2Ta_2O_9$, $Pb_5Ge_5O_{11}$, $SrBi_2Nb_2O_9$, and/or $YMnO_3$.

The two-dimensional material layers 20B may be stressor layers. The two-dimensional material layers 20B may include a hexagonal boron nitride (h-BN). The two-dimensional material layers 20B may be an insulating material. The two-dimensional material layers 20B may include an insulating h-BN.

A thickness of each of the data storage layers 20F may be greater than a thickness of each of the two-dimensional material layers 20B.

In example embodiments, to improve performance and reliability of the memory device 1, a thickness of each of the two-dimensional material layers 20B may be in a range from about 3 angstroms to about 10 angstroms and a thickness of each of the data storage layers 20F may be in a range from about 10 angstroms to about 200 angstroms.

Each of the two-dimensional material layers 20B may include a single layer or multiple layers.

When each of the two-dimensional material layers 20B includes multiple layers, each of the two-dimensional material layers 20B may include two or three layers. For example, a single two-dimensional material layer 20B may include a first single layer 20B_1, a second single layer 20B_2, and a third single layer 20B_3 sequentially stacked.

Among the two-dimensional material layers 20B and the data storage layers 20F of the stack structure 20, a lowermost layer may be a lowermost two-dimensional material layer 20B_L, and an uppermost layer may be an uppermost two-dimensional material layer 20B_U. The lower dielectric layer 5 may be in contact with the lowermost two-dimensional material layer 20B_L, and the conductive electrode GE may be in contact with the uppermost two-dimensional material layer 20B_U.

The data storage layers 20F, which may be formed of a ferroelectric material, may have polarization characteristics according to an electric field applied by the conductive electrode GE, and may have remnant polarization caused by dipoles even in the absence of an external electric field. Data may be written using a polarization state in the data storage layers 20F.

The two-dimensional material layers 20B, which may be stressors, may be inserted between the data storage layers 20F to enhance polarization of the data storage layers 20F. Accordingly, the reliability and durability of the memory device 1 may be improved.

The two-dimensional material layers 20B, which may be stressors, may be inserted between the data storage layers 20F to improve distribution characteristics of the memory device 1.

The two-dimensional material layers 20B may be inserted between the data storage layers 20F and the data storage layers 20F may be formed of a plurality of layers, so that a memory window may be improved and multiple bits may be implemented. As a result, the performance of the memory device 1 may be improved.

Hereinafter, various modified examples of elements of the above-described memory device 1 will be described. Various modified examples of the elements of the above-described memory device 1 to be described below will be mainly described with respect to modified or replaced elements. In addition, modifiable or replaceable elements to be described below may be combined with each other or may be combined with the above-described elements to constitute the memory device 1 according to an example embodiment.

Various modified examples of the stack structure 20 of the data storage structure DS of FIG. 1 will be described with reference to FIGS. 2, 3, 4, 5, 6, and 7, respectively. FIGS. 2, 3, 4, 5, 6, and 7 are cross-sectional views illustrating various modified examples of the stack structure 20 of the data storage structure DS of FIG. 1.

Figure 2:
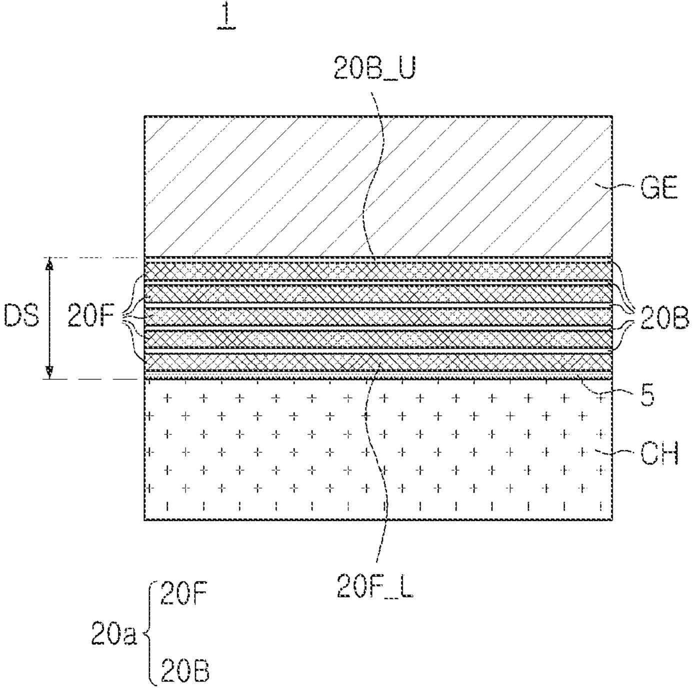
FIG. 2 is a cross-sectional view illustrating a modified example of a memory device according to an example embodiment.

In a modified example, referring to FIG. 2, in the data storage structure DS of FIG. 1, the stack structure 20 of FIG. 1 may be replaced with a stack structure 20*a* including a data storage layer contacting the lower dielectric layer 5, and a two-dimensional material layer contacting the conductive electrode GE.

Among the two-dimensional material layers 20B and the data storage layers 20F of the stack structure 20*a*, a lowermost layer may be a lowermost data storage layer 20F_L, and an uppermost layer may be an uppermost two-dimensional material layer 20B_U. The lowermost data storage layer 20F_L may contact the lower dielectric layer 5. The uppermost two-dimensional material layer 20B_U may contact the conductive electrode GE.

Figure 3:
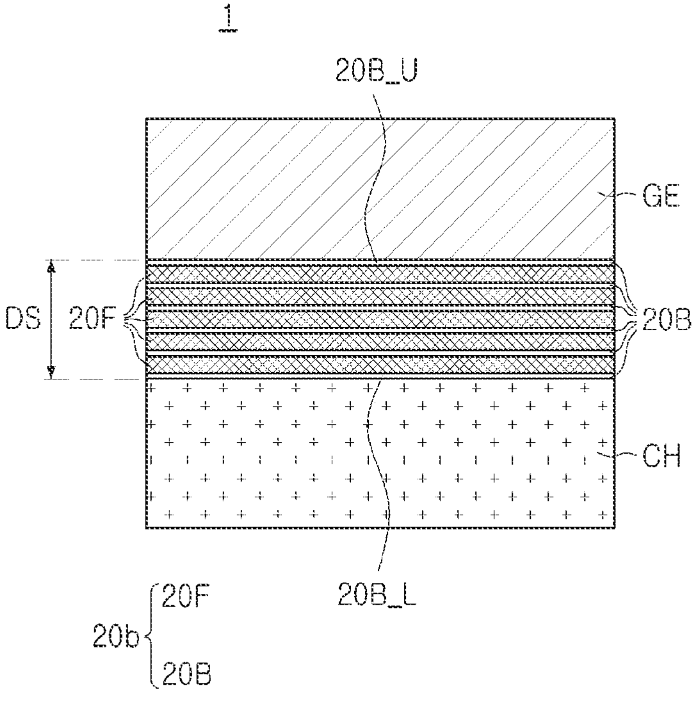
FIG. 3 is a cross-sectional view illustrating a modified example of a memory device according to an example embodiment.

In a modified example, referring to FIG. 3, in the data storage structure DS of FIG. 1, the lower dielectric layer 5 may be omitted, and the stack structure 20 of FIG. 1 may be replaced with a stack structure 20*b* including a two-dimensional material layer contacting the channel region CH, and a two-dimensional material layer contacting the conductive electrode GE.

Among the two-dimensional material layers 20B and the data storage layers 20F of the stack structure 20*b*, a lowermost layer may be a lowermost two-dimensional material layer 20B_L, and an uppermost layer may be an uppermost two-dimensional material layer 20B_U. The lowermost two-dimensional material layer 20B_L may contact the channel region CH. The uppermost two-dimensional material layer 20B_U may contact the conductive electrode GE.

Figure 4:
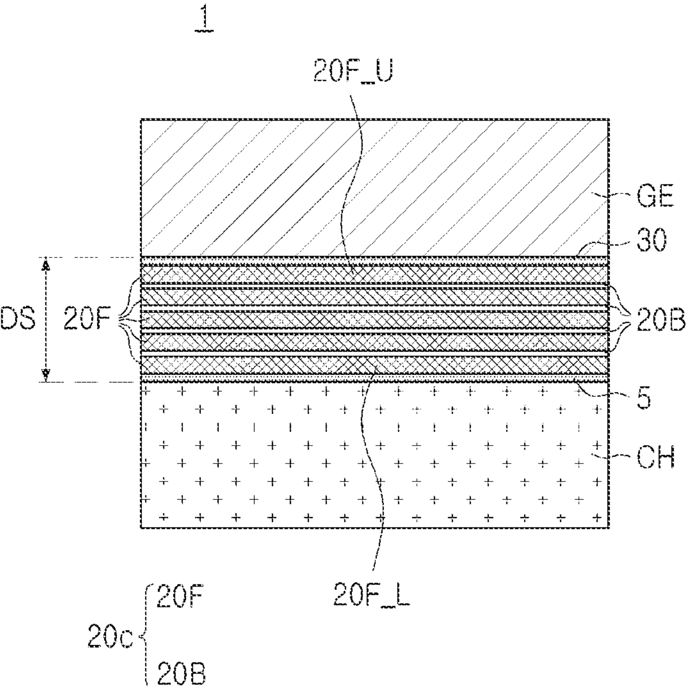
FIG. 4 is a cross-sectional view illustrating a modified example of a memory device according to an example embodiment.

In a modified example, referring to FIG. 4, the data storage structure DS of FIG. 1 may further include an upper dielectric layer 30 below the conductive electrode GE, and the stack structure 20 of FIG. 1 may be replaced with the stack structure 20*c* as illustrated in FIG. 4. The upper dielectric layer 30 may include a high-κ dielectric material.

Among the two-dimensional material layers 20B and the data storage layers 20F of the stack structure 20*c*, a lowermost layer may be a lowest data storage layer 20F_L, and an uppermost layer may be an uppermost data storage layer 20F_U. The lowermost data storage layer 20F_L may contact the lower dielectric layer 5, and the uppermost data storage layer 20F_U may contact the upper dielectric layer 30.

Figure 5:
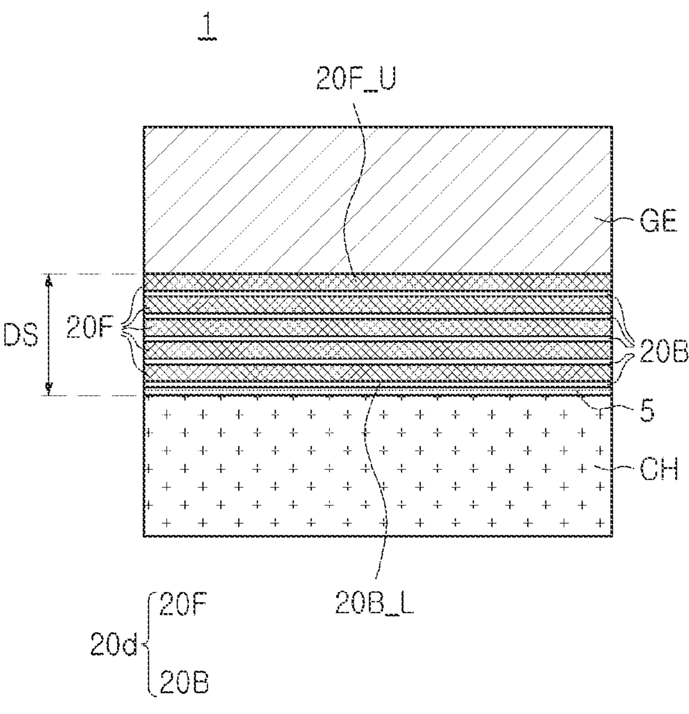
FIG. 5 is a cross-sectional view illustrating a modified example of a memory device according to an example embodiment.

In a modified example, referring to FIG. 5, in the data storage structure DS of FIG. 1, the stack structure 20 of FIG. 1 may be replaced with a stack structure 20*d* including a data storage layer contacting the conductive electrode GE, and a two-dimensional material layer contacting the lower dielectric layer 5.

Among the two-dimensional material layers 20B and the data storage layers 20F of the stack structure 20*d*, the lowermost layer may be a lowermost two-dimensional material layer 20B_L, and the uppermost layer may be an uppermost data storage layer 20F_U. The lowermost two-dimensional material layer 20B_L may contact the lower dielectric layer 5, and the uppermost data storage layer 20F_U may contact the conductive electrode GE.

Figure 6:
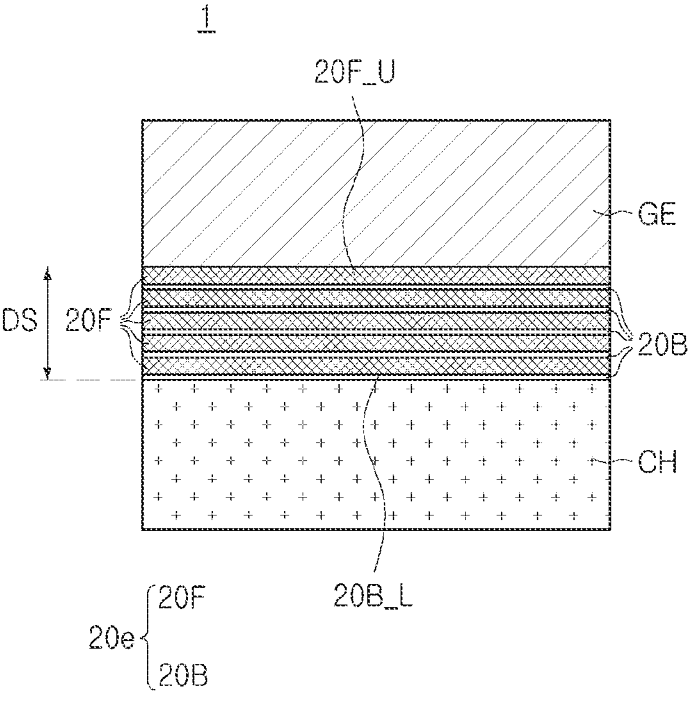
FIG. 6 is a cross-sectional view illustrating a modified example of a memory device according to an example embodiment.

In a modified example, referring to FIG. 6, in the data storage structure DS of FIG. 1, the lower dielectric layer 5 may be omitted, and the stack structure 20 of FIG. 1 may be replaced with a stack structure 20*e* including a two-dimensional material layer contacting the channel region CH, and a data storage layer contacting the conductive electrode GE.

Among the two-dimensional material layers 20B and the data storage layers 20F of the stack structure 20*e*, a lowermost layer may be a lowermost two-dimensional material layer 20B_L, and an uppermost layer may be an uppermost data storage layer 20F_U. The lowermost two-dimensional material layer 20B_L may contact the channel region CH, and the uppermost data storage layer 20F_U may contact the conductive electrode GE.

Figure 7:
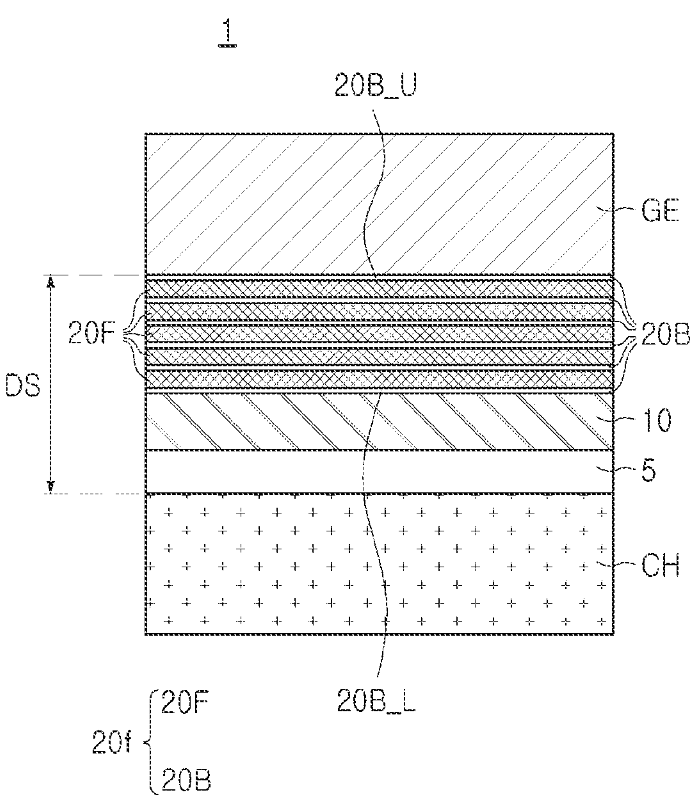
FIG. 7 is a cross-sectional view illustrating a modified example of a memory device according to an example embodiment.

In a modified example, referring to FIG. 7, the data storage structure DS of FIG. 1 may further include a data storage layer 10 on the lower dielectric layer 5, and the stack structure 20 of FIG. 1 may be replaced with a stack structure 20*f* contacting the data storage layer 10.

Among the two-dimensional material layers 20B and the data storage layers 20F of the stack structure 20*f*, a lowermost layer may be a lowermost two-dimensional material layer 20B_L, and an uppermost layer may be an uppermost two-dimensional material layer 20B_U. The lowermost two-dimensional material layer 20B_L may contact the data storage layer 10, and the uppermost two-dimensional material layer 20B_U may contact the conductive electrode GE.

In another embodiment, the stack structure 20 of FIG. 1 may be replaced with any one of the stack structures 20*a*, 20*b*, 20*c*, 20*d*, and 20*e* illustrated in FIGS. 2 to 6.

Next, various examples of the memory device 1 will be described with reference to FIGS. 8 to 22. Memory devices of various examples to be described below may include any one of the various data storage structures DS described with reference to FIGS. 1 to 7. For example, the memory device of various examples to be described below may include the data storage structure DS described with reference to FIG. 1, but example embodiments are not limited thereto. For example, the memory devices of various examples to be described below may include any one of the data storage structures DS described with reference to FIGS. 2 to 7, rather than the data storage structure DS of FIG. 1.

Figure 8:
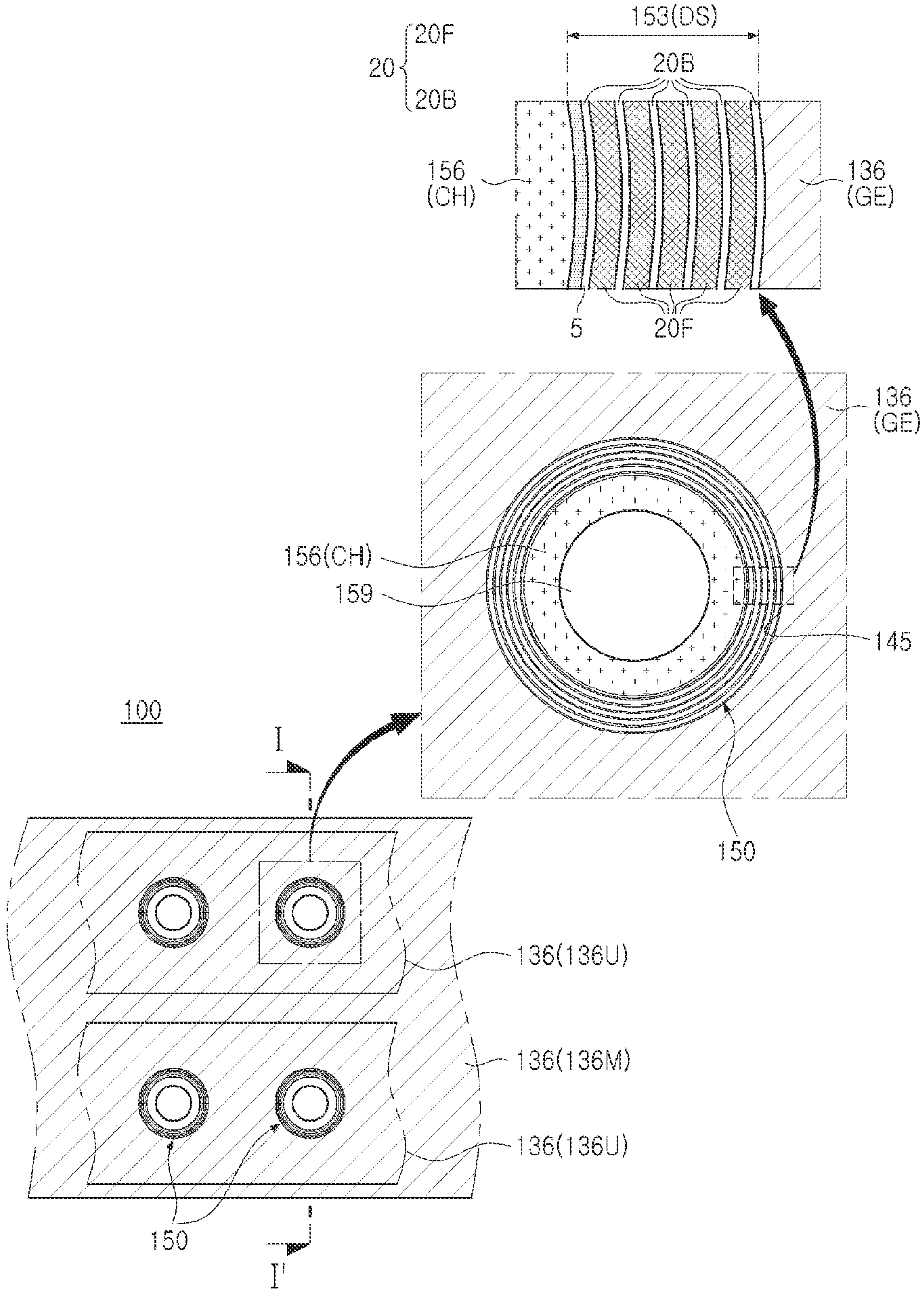
FIGS. 8, 9A, and 9B are views illustrating a modified example of a memory device according to an example embodiment.
Figure 9A:
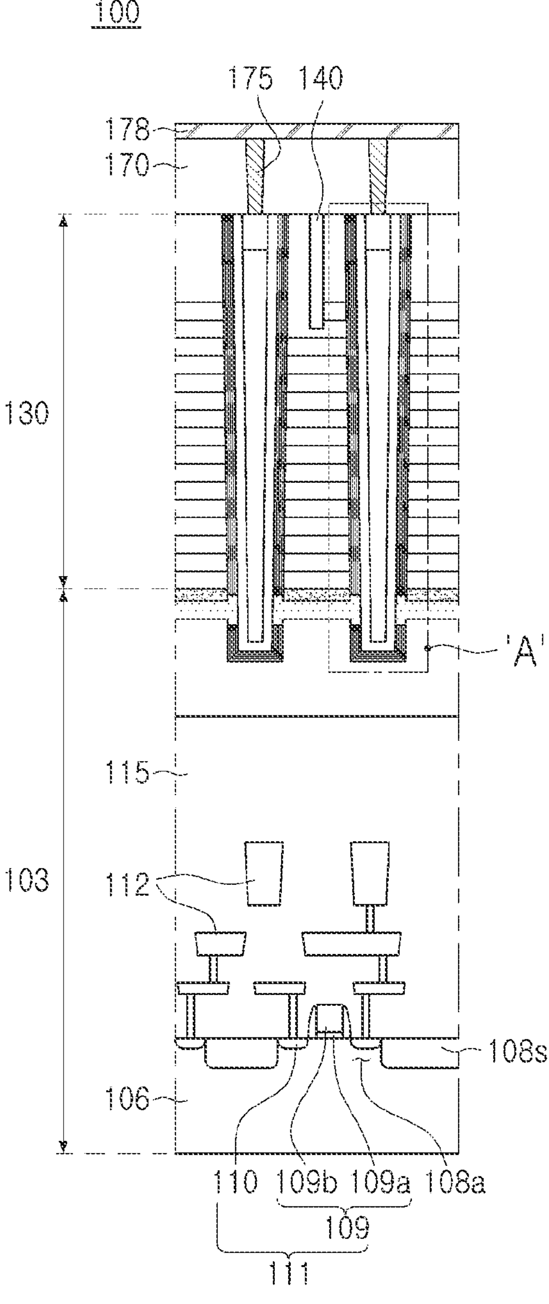
Figure 9B:
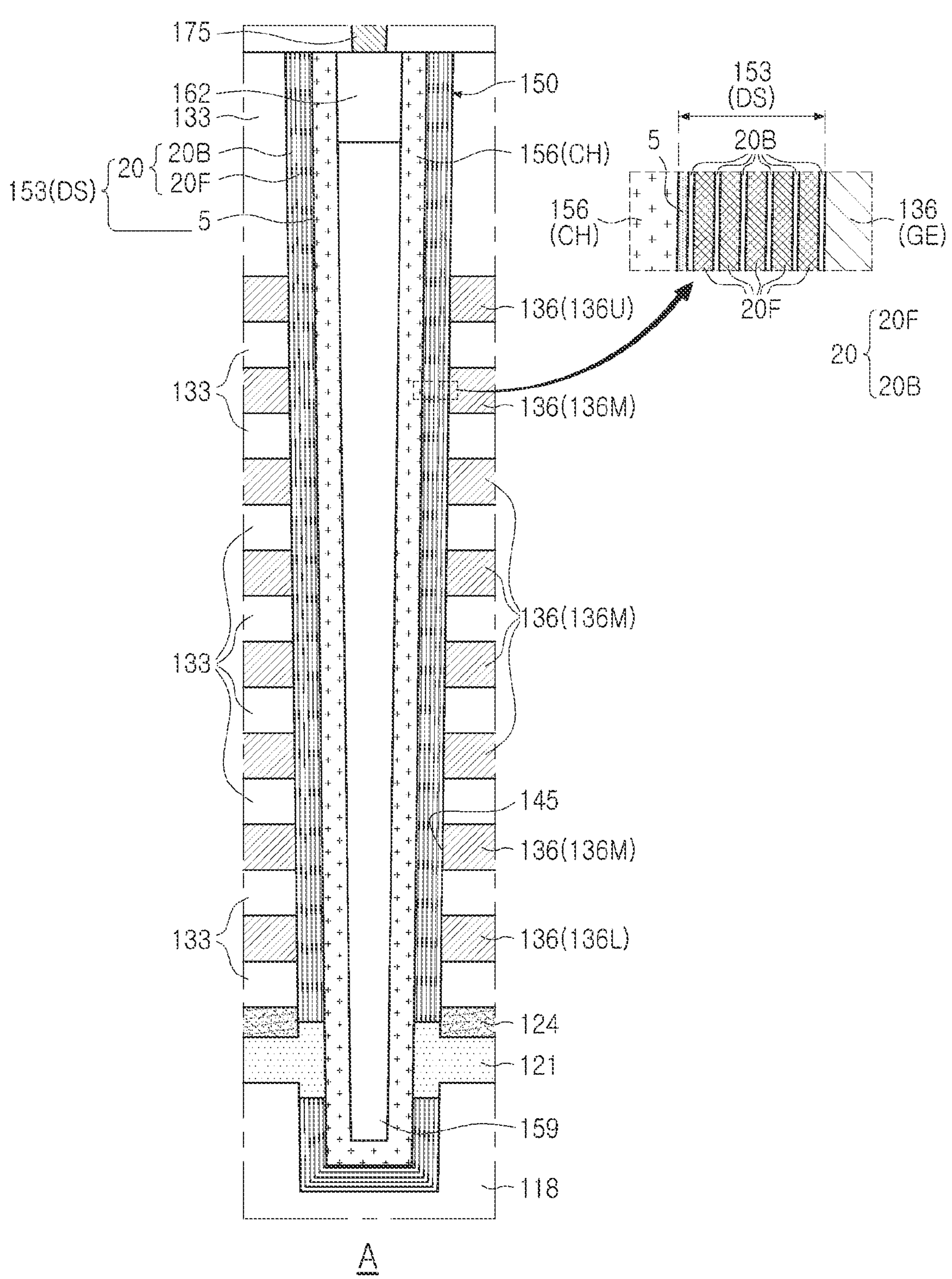

FIGS. 8, 9A, and 9B are diagrams illustrating an example of a memory device according to an example embodiment. FIG. 8 is a plan view illustrating an example of a memory device according to an example embodiment, FIG. 9A is a cross-sectional view illustrating a region taken along line I-I' of FIG. 8, and FIG. 9B is a partially enlarged view of region 'A' of FIG. 9A.

Referring to FIGS. 8, 9A, and 9B, a memory device 100 according to an example embodiment may include a lower structure 103, a gate stack structure 130 on the lower structure 103, a vertical memory structure 150 penetrating through the gate stack structure 130, a contact plug 175 on the vertical memory structure 150, and a bitline 178 on the contact plug 175.

The lower structure 103 may include a substrate 106, an isolation region 108*s* defining an active region 108*a* on the substrate 106, a peripheral circuit 111 on the substrate 106, a circuit interconnection structure 112 on the peripheral circuit 111, a peripheral insulating structure 115 covering the peripheral circuit 111 and the circuit interconnection structure 112 on the substrate 106, and a plate layer 118 on the peripheral insulating structure 115.

The peripheral circuit 111 may include a transistor including a peripheral gate 109 on the active region 108*a* and peripheral source/drain regions 110 on opposite sides adjacent to the peripheral gate 109. The peripheral gate 109 may include a peripheral gate dielectric layer 109*a* and a peripheral gate electrode 109*b* on the peripheral gate dielectric layer 109*a*.

The gate stack structure 130 may include interlayer insulating layers 133 and gate electrodes 136 alternately stacked. The gate electrodes 136 may include a lower gate electrode 136L, middle gate electrodes 136M on the lower gate electrode 136L, and upper gate electrodes 136U on the middle gate electrodes 136M. Among the interlayer insulating layers 133 and the gate electrodes 136, a lowermost layer and an uppermost layer may be interlayer insulating layers. The lower gate electrode 136L may be a lower select gate electrode, and the upper gate electrodes 136U may be upper select gate electrodes, for example, string select gate electrodes. The middle gate electrodes 136M may be wordlines.

The gate electrodes 136 may be the conductive electrodes GE described with reference to FIGS. 1 to 7. For example, the middle gate electrodes 136M, which may be wordlines, may be the conductive electrodes GE described with reference to FIGS. 1 to 7, and data may be stored in the data storage structure 153 between the middle gate electrodes 136M, which may be wordlines, and the channel layer 156.

The memory device 100 may further include an upper separation insulating pattern 140 penetrating through the upper gate electrodes 136U on the middle gate electrodes 136M.

The vertical memory structure 150 may be disposed in a hole 145 penetrating through the gate stack structure 130. The vertical memory structure 150 may include an insulating core pattern 159, a channel layer 156 on a side surface of the insulating core pattern 159, a data storage structure 153 on an external side surface of the channel layer 156, and a pad pattern 162 on the insulating core pattern 159.

Each of the regions of the channel layer 156, facing the gate electrodes 136, may be the channel region CH described with reference to FIGS. 1 to 7.

The channel layer 156 and the data storage structure 153 may continuously extend from a level, lower than a level of the lower gate electrode 136L, to a level, higher than a level of the upper gate electrode 136U, among the gate electrodes 136.

The memory device 100 may further include a first horizontal pattern 121 on the plate layer 118 and a second horizontal pattern 124 on the first horizontal pattern 121. The second horizontal pattern 124 may be disposed below the gate stack structure 130. The vertical memory structure 150 may extend inwardly of the plate layer 118 through the first and second horizontal patterns 121 and 124.

The first horizontal pattern 121 may penetrate through the data storage structure 153 and may contact the channel layer 156.

The plate layer 118 may include doped polysilicon, for example, polysilicon having N-type conductivity. The first horizontal pattern 121 may include doped polysilicon, for example, polysilicon having N-type conductivity. The second horizontal pattern 124 may include doped polysilicon, for example, polysilicon having N-type conductivity.

The data storage structure 153 may be one of the data storage structures DS described with reference to FIGS. 1 to 7. For example, the data storage structure 153 may include the data storage structure DS as illustrated in FIG. 1, for example, the lower dielectric layer 5 and the stack structure 20. The lower dielectric layer 5 may contact the channel layer 156. The stack structure 20 may include the two-dimensional material layers 20B and the data storage layers 20F alternately stacked as described with reference to FIG. 1.

As illustrated in the plan view of FIG. 8, the data storage structure 153 may have a ring shape surrounding the ring-shaped channel layer 156.

Figure 10:
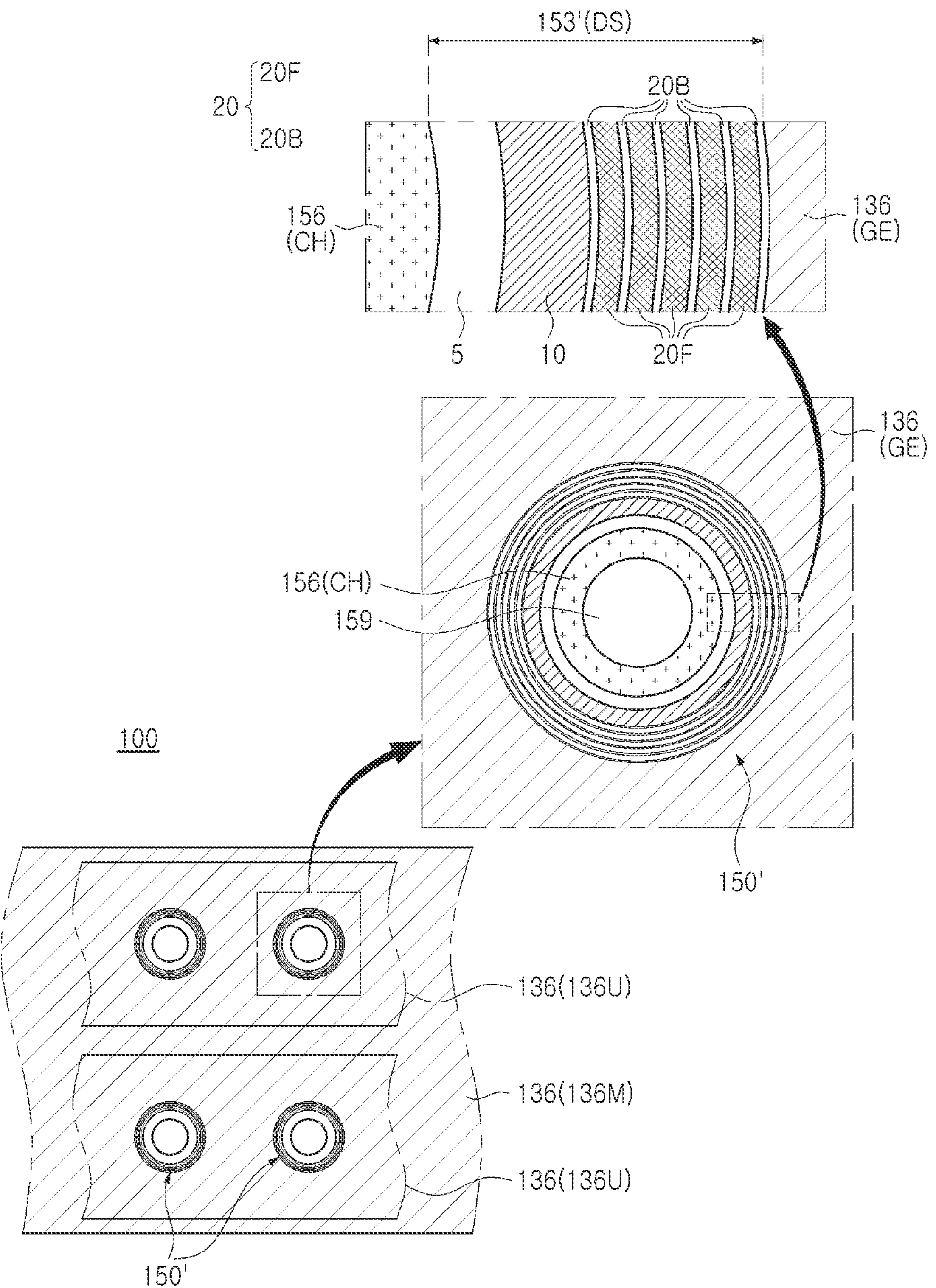
FIG. 10 is a plan view illustrating a modified example of a memory device according to an example embodiment.

In another example, the data storage structure 153 may be modified into a data storage structure 153' including the data storage structure (DS of FIG. 7) as illustrated in FIG. 7. The modified data storage structure 153' will be described with reference to FIG. 10. FIG. 10 is a plan view illustrating a modified example of a memory device according to an example embodiment.

Referring to FIG. 10, a vertical memory structure 150' may be substantially the same as the vertical memory structure 150 described above with reference to FIGS. 8, 9A, and 9B. However, the data storage structure 153 in FIGS. 8, 9A and 9B is modified into a data storage structure 153' including a data storage structure (DS of FIG. 7) as illustrated in FIG. 7. The data storage structure 153' may include the lower dielectric layer 5 and the stack structure 20 as illustrated in FIGS. 8, 9A and 9B, and may further include a data storage layer 10 between the stack structure 20 and the lower dielectric layer 5 as described in FIG. 7.

Figure 11:
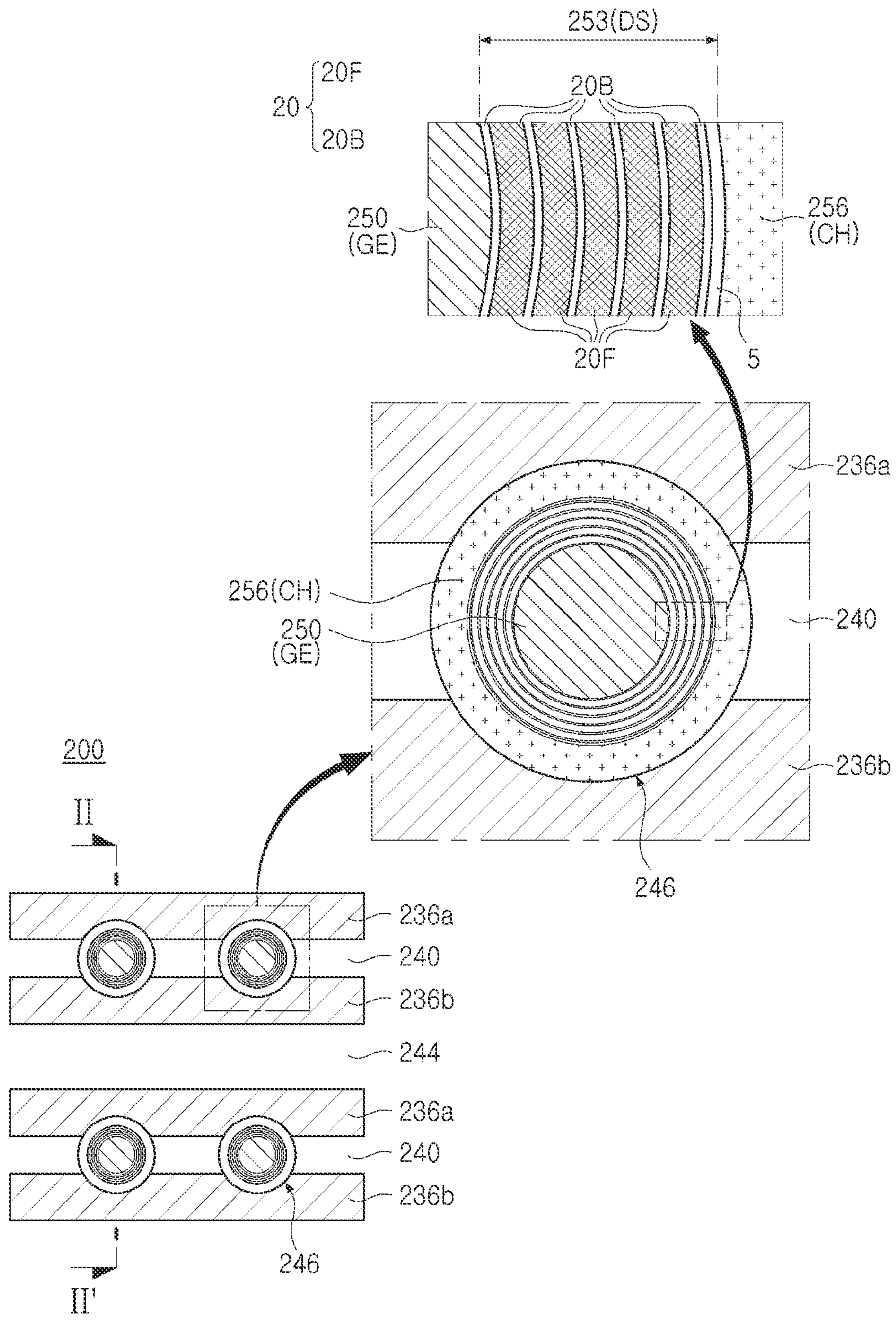
FIGS. 11, 12A, and 12B are views illustrating a modified example of a memory device according to an example embodiment.
Figure 12A:
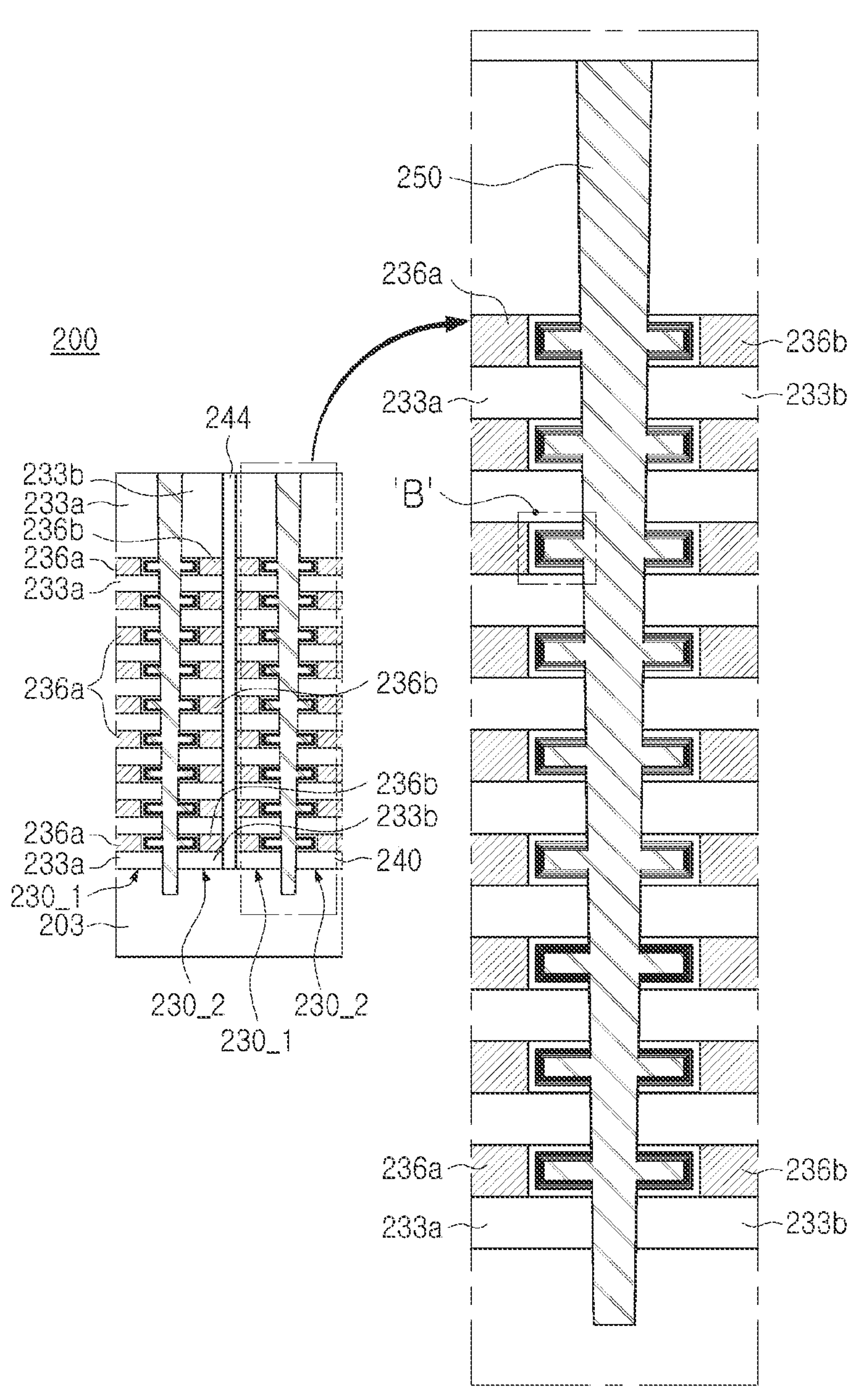
Figure 12B:
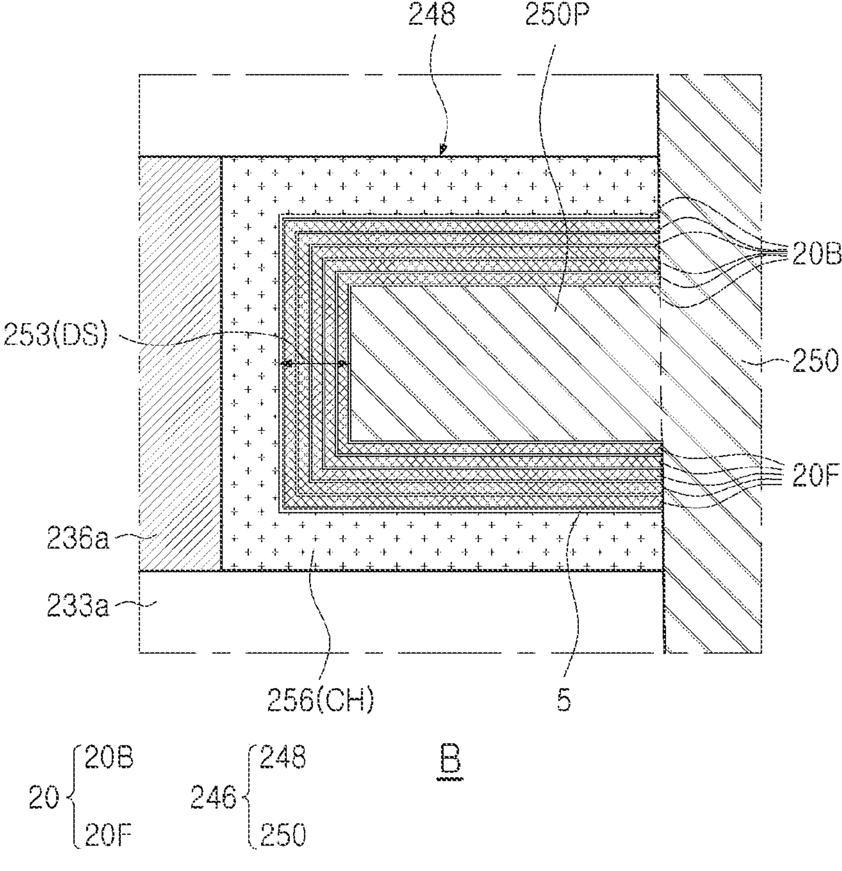

FIGS. 11, 12A, and 12B are views illustrating another example of a memory device according to an example embodiment. FIG. 11 is a plan view illustrating another example of a memory device according to an example embodiment, FIG. 12A is a cross-sectional view illustrating a region taken along line II-II' of FIG. 11, and FIG. 12B is a partially enlarged view of region 'B' of FIG. 12A.

Referring to FIGS. 11, 12A, and 12B, a memory device 200 according to an example embodiment may include a lower structure 203, a first stacked region 230_1 disposed on the lower structure 203, a second stacked region 230_2, and a vertical memory structure 246 penetrating between the first stacked region 230_1 and the second stacked region 230_2. The lower structure 203 may be a substrate on which a peripheral circuit and a peripheral interconnection structure are formed.

The first stacked region 230_1 may include first interlayer insulating layers 233*a* and first conductive lines 236*a* stacked alternately and repeatedly in a vertical direction. The second stacked region 230_2 may include second interlayer insulating layers 233*b* and second conductive lines 236*b* stacked alternately and repeatedly in the vertical direction.

The memory device 200 may further include an insulating region 240 between the first stacked region 230_1 and the second stacked region 230_2. The vertical memory structure 246 may penetrate through the insulating region 240.

A pair of the first and second stacked regions 230_1 and 230_2 may be repeatedly arranged. The memory device 200 may further include a separation insulating region 244 disposed between the pair of the first and second stacked regions 230_1 and 230_2 and the other pair of the first and second stacked regions 230_1 and 230_2.

The vertical memory structure 246 may include ring patterns 248, stacked while being spaced apart from each other in the vertical direction, and a conductive structure 250 penetrating through the ring patterns 248.

Each of the ring patterns 248 may include a channel region 256 and a data storage structure 253. The channel region 256 may be disposed to surround a side surface of the conductive structure 250. The data storage structure 253 may be disposed between the channel region 256 and the conductive structure 250.

The conductive structure 250 may include protrusions 250P extending inwardly of the ring patterns 248. For example, the conductive structure 250 may include one or more protrusions 250P extending into the ring patterns 248. The channel region 256 and the data storage structure 253 may cover an upper surface, a lower surface, and a side surface of each of the protrusions 250P.

The conductive structure 250 may be the conductive electrode GE described with reference to FIGS. 1 to 7. The channel region 256 may be the channel region CH described with reference to FIGS. 1 to 7.

The data storage structure 253 may be one of the data storage structures DS described with reference to FIGS. 1 to 7. For example, the data storage structure 253 may include the data storage structure DS as illustrated in FIG. 1 including, for example, the lower dielectric layer 5 and the stack structure 20. The lower dielectric layer 5 may contact the channel region 256. The stack structure 20 may include the data storage layers 20F and the two-dimensional material layers 20B as described with reference to FIG. 1.

In an example embodiment, the conductive structure 250 may be a gate electrode, the first conductive lines 236*a* may be bitlines, and the second conductive lines 236*b* may be source lines.

Figure 13:
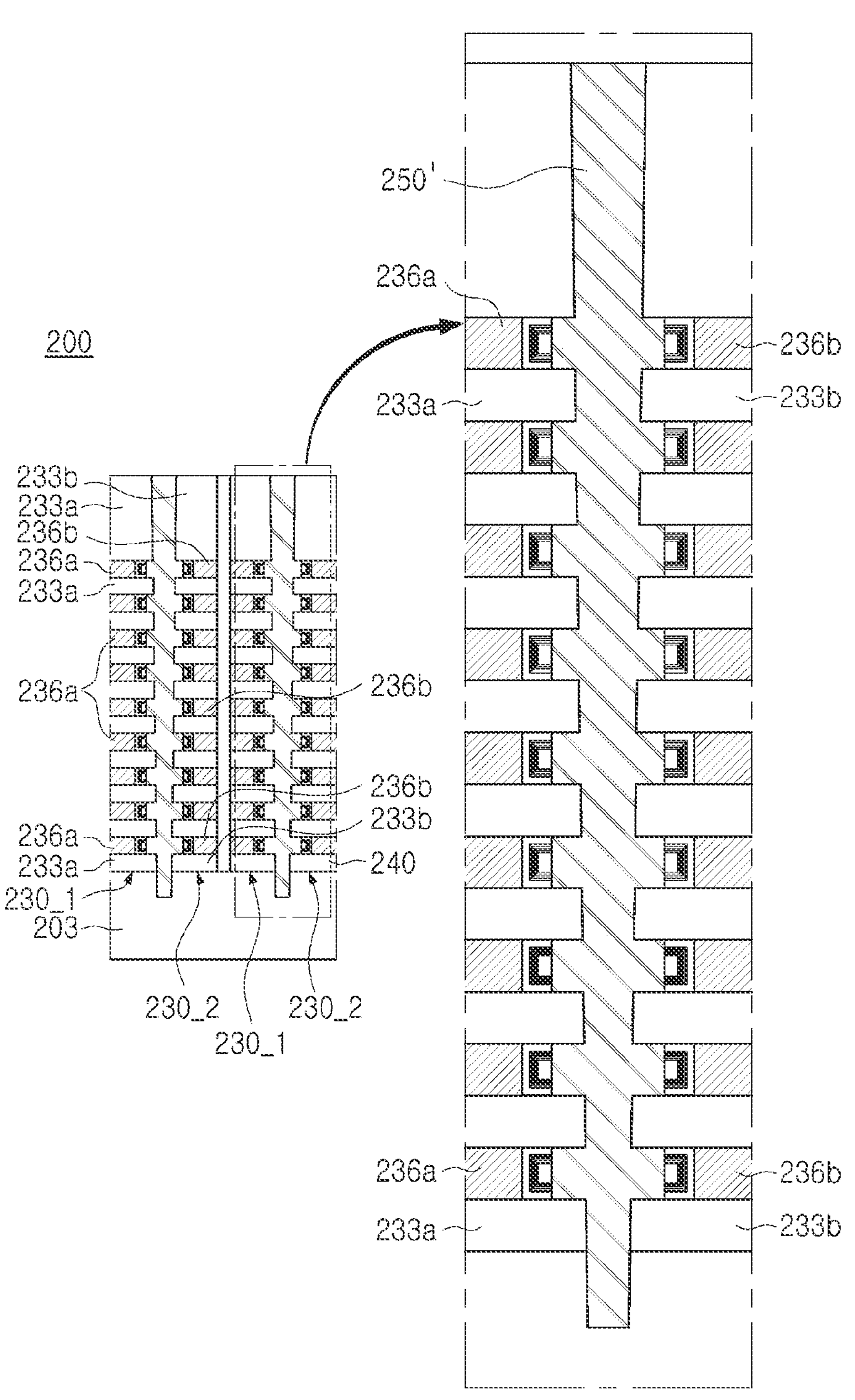
FIG. 13 is a cross-sectional view illustrating a modified example of a memory device according to an example embodiment.

FIG. 13 is a cross-sectional view illustrating a region taken along line II-II' of FIG. 11 to describe a modified example of a memory device according to an example embodiment.

Referring to FIG. 13, the conductive structure 250 of FIGS. 12A and 12B may be modified into a conductive structure 250' including first protrusions 250P1 and second protrusions 250P2 extending inwardly of the ring patterns 248 from the first protrusions 250P1.

The first protrusions 250P1 may have substantially the same vertical thickness as the ring patterns 248. The second protrusions 250P2 may be substantially the same as the protrusions 250P of FIG. 12B. A thickness of each of the first protrusions 250P1 may be greater than a thickness of each of the second protrusions 250P2.

Figure 14:
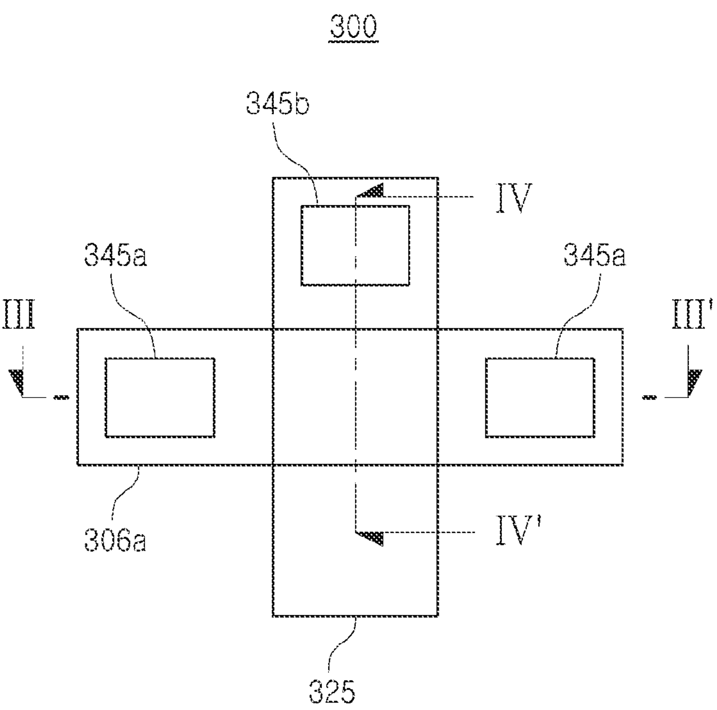
FIGS. 14 and 15 are views illustrating a modified example of a memory device according to an example embodiment.
Figure 15:
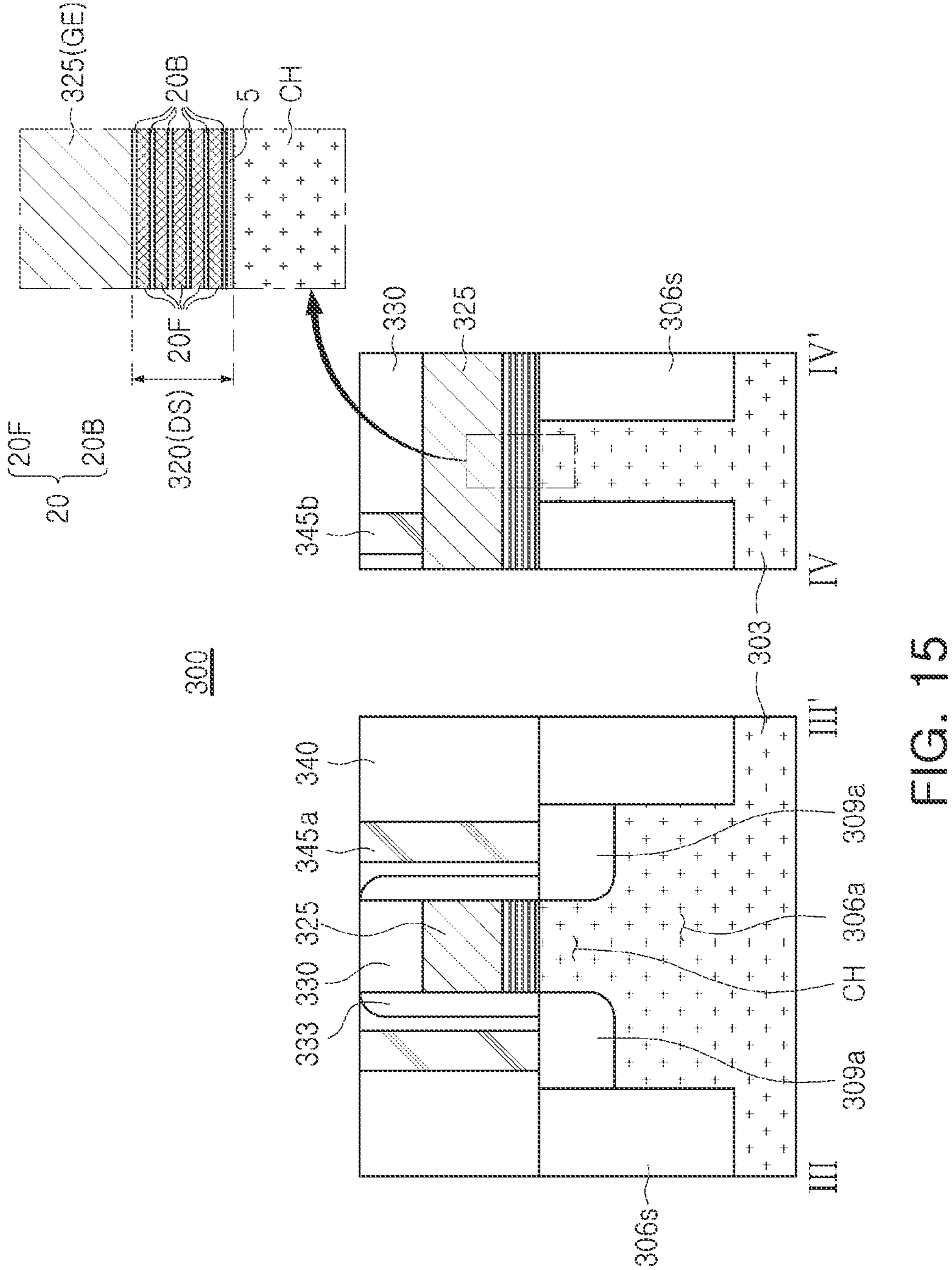

FIGS. 14 and 15 are views illustrating another example of a memory device according to an example embodiment. FIG. 14 is a plan view illustrating another example of a memory device according to an example embodiment, and FIG. 15 is a cross-sectional view of regions taken along lines III-III' and IV-IV' of FIG. 14.

Referring to FIGS. 14 and 15, a memory device 300 according to an embodiment may include a substrate 303, an active region 306*a* on the substrate 303, an isolation region 306*s* defining the active region 306*a* on the substrate 303, a gate electrode 325 intersecting the active region 306*a* and extending upwardly of the isolation region 306*s*, source/drain regions 309*a* disposed in the active region 306*a* on opposite sides of the gate electrode 325, and a data storage structure 320 disposed between the gate electrode 325 and the active region 306*a* and extending between the gate electrode 325 and the device isolation region 306*s*. The substrate 303 may be a semiconductor substrate.

The active region 306*a* between the source/drain regions 309*a* may be a channel region CH. The gate electrode 325 may be the conductive electrode GE described with reference to FIGS. 1 to 7.

The data storage structure 320 may be one of the data storage structures DS described with reference to FIGS. 1 to 7. For example, the data storage structure 320 may include the data storage structure DS as illustrated in FIG. 1 including, for example, the lower dielectric layer 5 and the stack structure 20. The lower dielectric layer 5 may contact the channel region CH. The stack structure 20 may include the data storage layers 20F and the two-dimensional material layers 20B as described with reference to FIG. 1.

The memory device 300 may further include an insulating capping layer 330 on the gate electrode 325, insulating spacers 333 on side surfaces of the gate electrode 325 and the insulating capping layer 330, and an interlayer insulating layer 340 on an isolation region 306*s* and the active region 306*a*.

The memory device 300 may further include a source/drain contact plug 345*a* penetrating through the interlayer insulating layer 340 and electrically connected to the source/drain regions 309*a*, and a gate contact plug 345*b* penetrating through the insulating capping layer 330 and electrically connected to the gate electrode 325.

Figure 16:
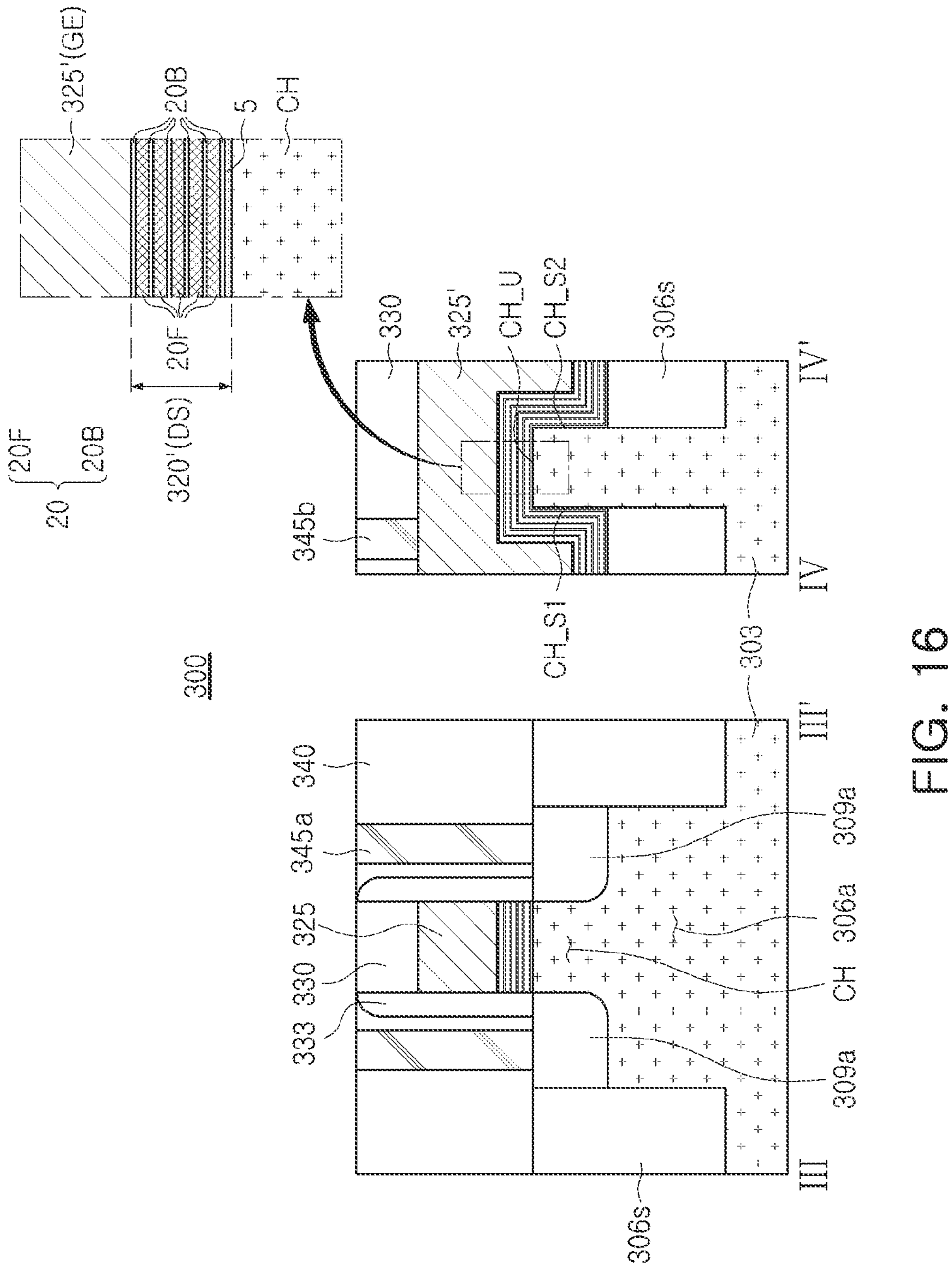
FIG. 16 is a cross-sectional view illustrating a modified example of a memory device according to an example embodiment.

FIG. 16 is a cross-sectional view illustrating regions taken along lines III-III' and IV-IV' of FIG. 14 to describe a modified example of a memory device according to an example embodiment.

Referring to FIG. 16, the gate electrode 325 of FIG. 15 may be replaced with a gate electrode 325' covering an upper surface CH_U, a first side surface CH_S1, and a second side surface CH_S2 of the channel region CH, and the data storage structure 320 of FIG. 15 may be replaced with a data storage structure 320' interposed between the gate electrode 325' and the channel region CH. The first and second side surfaces CH_S1 and CH_S2 of the channel region CH may oppose each other. Accordingly, the gate electrode 325' may cover three surfaces of the channel region CH.

Figure 17:
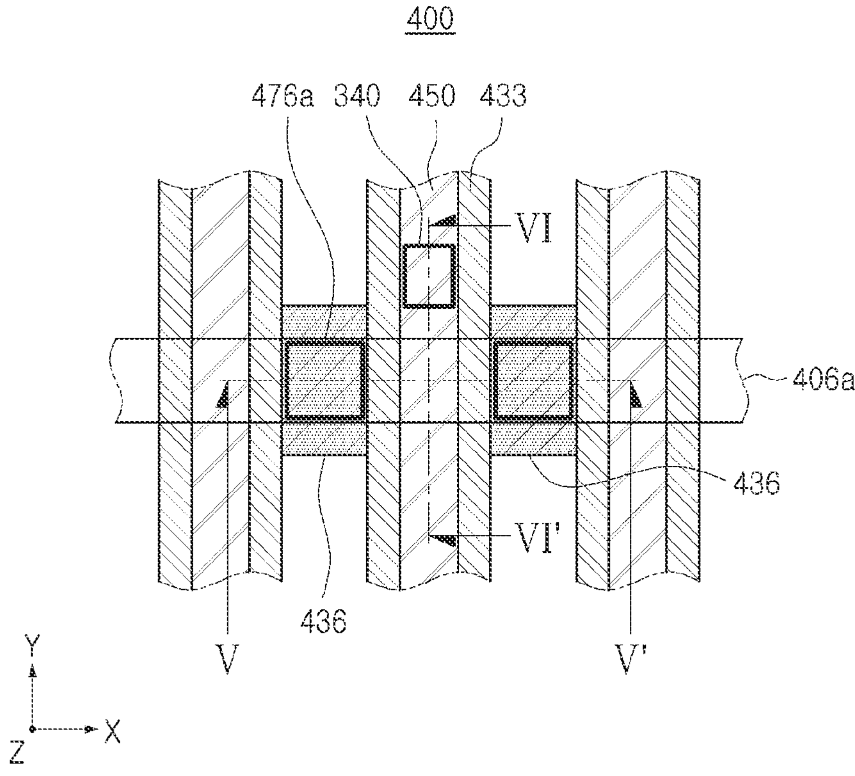
FIGS. 17 and 18 are views illustrating a modified example of a memory device according to an example embodiment.
Figure 18:
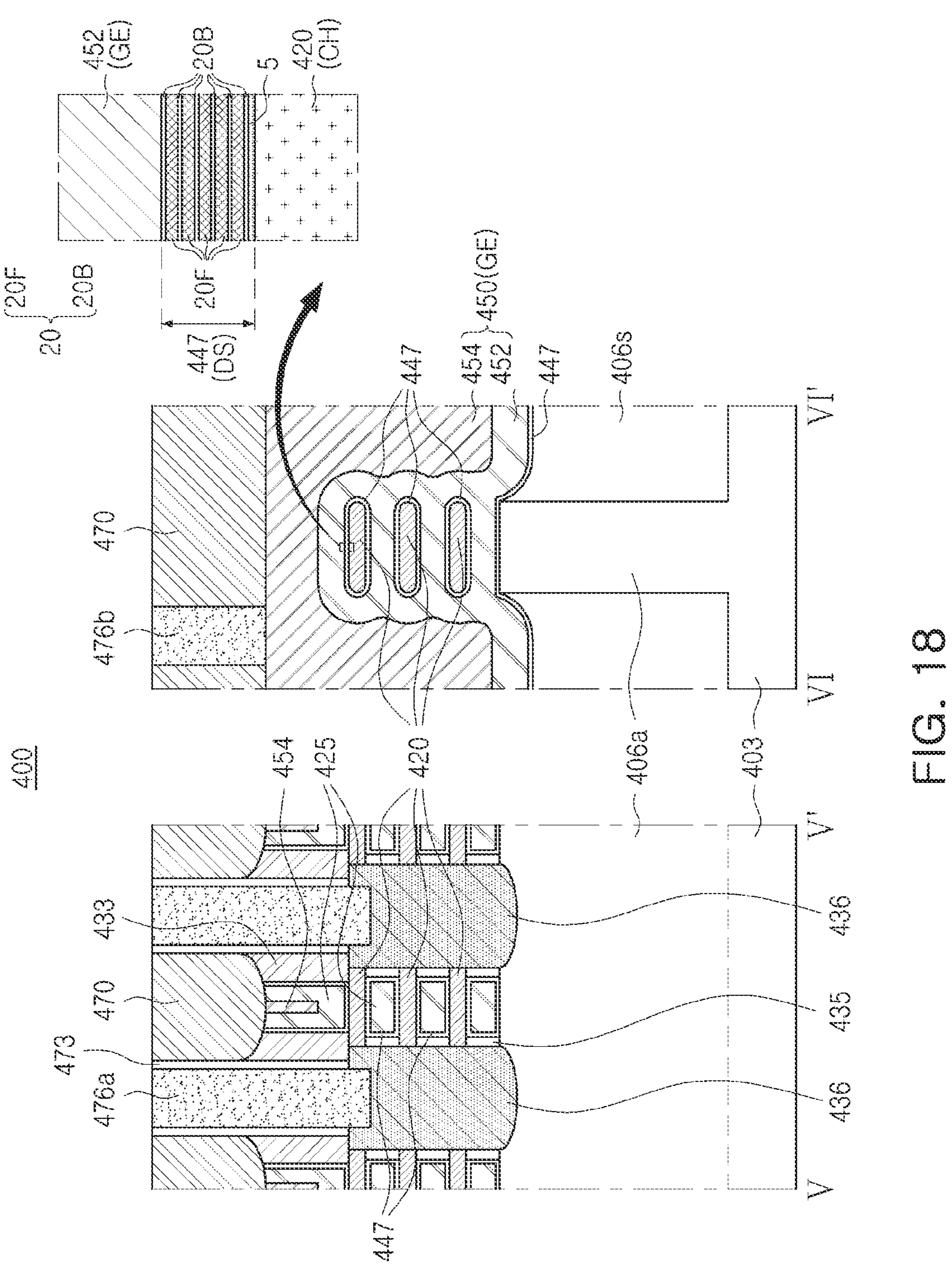

FIGS. 17 and 18 are views illustrating another example of a memory device according to an example embodiment. FIG. 17 is a plan view illustrating another example of a memory device according to an example embodiment, and FIG. 18 is a cross-sectional view of regions taken along lines V-V' and VI-VI' of FIG. 17.

Referring to FIGS. 17 and 18, a memory device 400 according to an example embodiment includes a substrate 403, an active fin 406*a* on the substrate 403, and an isolation region 406*s* on a side surface of the active fin 406*a*. The substrate 403 may be a semiconductor substrate. For example, the substrate 403 may be a single-crystalline semiconductor substrate that may be formed of a semiconductor material such as silicon. The device isolation region 406*s* may be formed of an insulating material such as a silicon oxide. The active fins 406*a* may have a line shape or a bar shape extending in a first direction X. The first direction X may be parallel to an upper surface of the substrate 403.

The memory device 400 may include source/drain regions 436 spaced apart from each other in the first direction X on the active fin 406*a*, a plurality of channel layers 420 stacked while being spaced apart from each other in a vertical direction Z on the active fin 406*a* and disposed between the source/drain regions 436, a gate electrode 450 extending in a second direction Y while intersecting the active fin 406*a* and surrounding each of the plurality of channel layers 420, and a data storage structure 447 including portions interposed between the gate electrode 450 and the plurality of channel layers 420 and a portion covering a lower surface of the gate electrode 450. As used herein, the channel layers 420 may also be referred to as active layers 420.

The plurality of channel layers 420 may be formed of a semiconductor material. For example, the plurality of channel layers 420 may be formed of a silicon material. In an example embodiment, the plurality of channel layers 420 may include three channel layers stacked while being spaced apart from each other in the vertical direction Z, but example embodiments are not limited thereto. For example, the plurality of channel layers 420 may include four or more channel layers stacked while being spaced apart from each other in the vertical direction Z.

The gate electrode 450 may include at least two electrode layers 452 and 454. For example, the gate electrode 450 may include a first electrode layer 452, contacting the data storage structure 447, and a second electrode layer 454 on the first electrode layer 452. The gate electrode 450 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotubes, or combinations thereof. The first and second electrode layers 452 and 454 may include different conductive materials.

The memory device 400 may further include first insulating spacers 433 on side surfaces of the gate electrode 450, an insulating capping layer 470 on the gate electrode 450 and the insulating spacers 433, source/drain contact plugs 476*a* on the source/drain regions 436, gate contact plugs 476*b* on the gate electrode 450, and an insulating spacer 473 contacting side surfaces of the source/drain contact plugs 476*a*.

The plurality of channel layers 420 may be the channel region CH described with reference to FIGS. 1 to 7, and the gate electrode 450 may be the conductive electrode GE described with reference to FIGS. 1 to 7.

The data storage structure 447 may be one of the data storage structures DS described with reference to FIGS. 1 to 7. For example, the data storage structure 447 may include the data storage structure DS as illustrated in FIG. 1 including, for example, the lower dielectric layer 5 and the stack structure 20. The lower dielectric layer 5 may contact the channel region CH. The stack structure 20 may include the data storage layers 20F and the two-dimensional material layers 20B as described with reference to FIG. 1.

Figure 19:
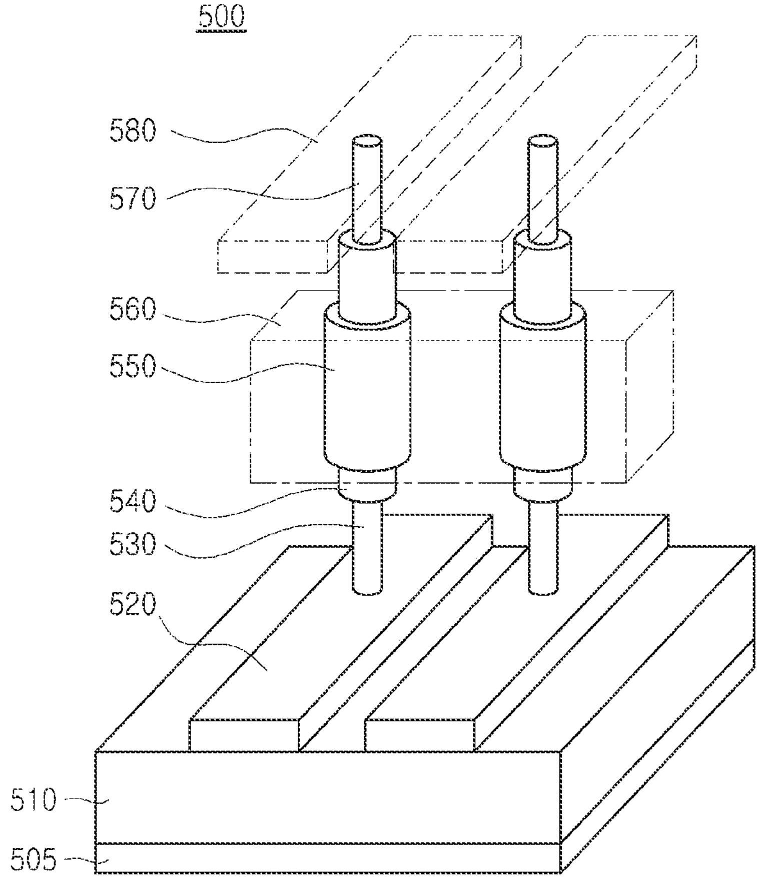
FIGS. 19 and 20 are views illustrating a modified example of a memory device according to an example embodiment.
Figure 20:
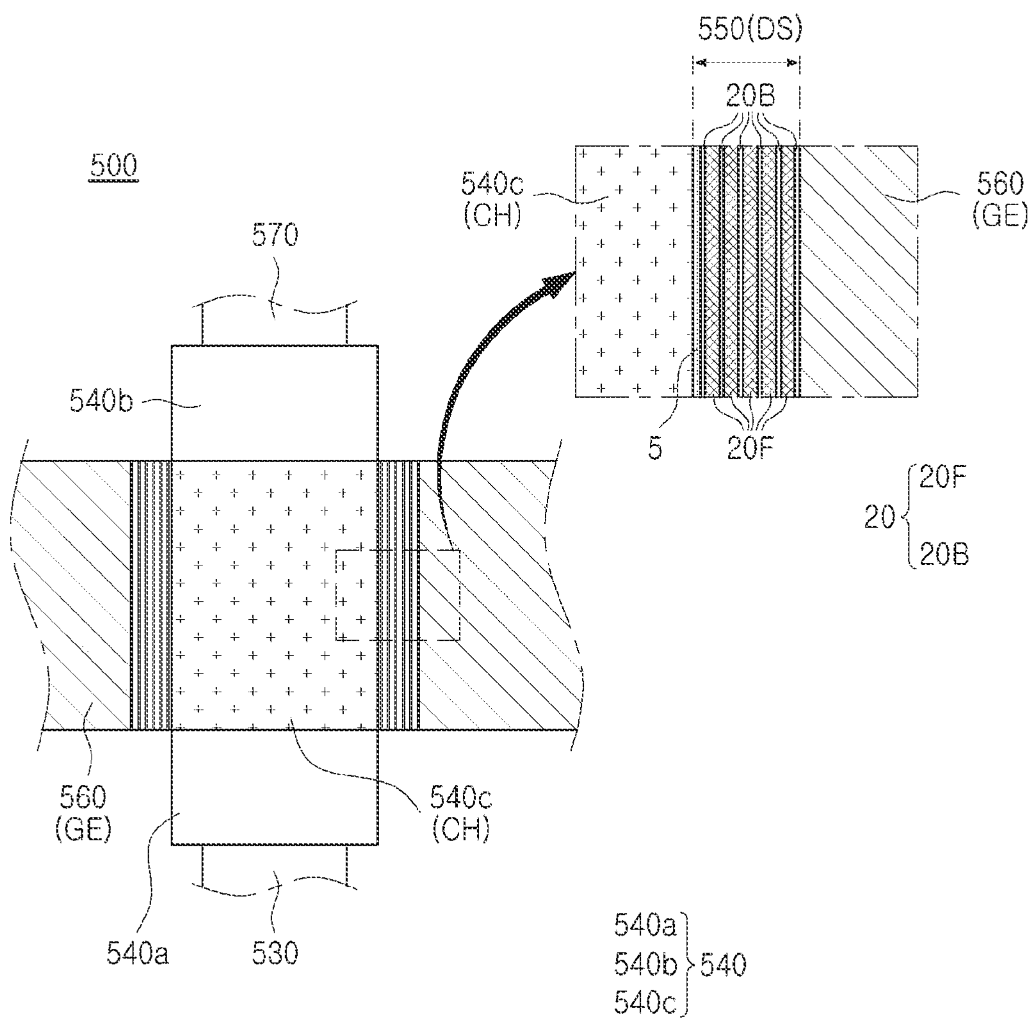

FIGS. 19 and 20 are diagrams illustrating another example of a memory device according to an example embodiment. FIG. 19 is a perspective view illustrating another example of a memory device according to an example embodiment, and FIG. 20 is a cross-sectional view illustrating some elements of FIG. 19.

Referring to FIGS. 19 and 20, a memory device 500 according to an example embodiment may include a substrate 505, a circuit region 510 on the substrate 505, a first conductive line 520 on the circuit region 510, a gate electrode 560 extending in a direction intersecting the first conductive line 520 and on the first conductive line 520, a vertical semiconductor pattern 540 penetrating the gate electrode 560, a first contact plug 530 between the vertical semiconductor pattern 540 and the first conductive line 520, a second conductive line 580 extending in a direction intersecting the gate electrode 560 and on the vertical semiconductor pattern 540, a second contact plug 570 between the vertical semiconductor pattern 540 and the second conductive line 580, and a data storage structure 550 between the gate electrode 560 and the vertical semiconductor pattern 540.

The gate electrode 560 may be a wordline, and one of the first conductive line 520 and the second conductive line 580 may be a bitline and the other thereof may be a source line.

The vertical semiconductor pattern 540 may include a lower source/drain 540*a*, an upper source/drain 540*b* on the lower source/drain 540*a*, and a channel region 540*c* between the lower source/drain 540*a* and the upper source/drain 540*b*.

The channel region 540*c* may be the channel region CH described with reference to FIGS. 1 to 7, and the gate electrode 560 may be the conductive electrode GE described with reference to FIGS. 1 to 7.

The data storage structure 550 may be one of the data storage structures DS described with reference to FIGS. 1 to 7. For example, the data storage structure 550 may include the data storage structure DS illustrated in FIG. 1 including, for example, the lower dielectric layer 5 and the stack structure 20. The lower dielectric layer 5 may contact the channel region (CH) 540*c*. The stack structure 20 may include the data storage layers 20F and the two-dimensional material layers 20B as described with reference to FIG. 1.

The channel region 540*c* may be a vertical channel region. The data storage structure 550 and the gate electrode 560 may cover an entire side surface of the channel region 540*c*, but example embodiments are not limited thereto. For example, the data storage structure 550 and the gate electrode 560 may be modified to cover some side surfaces of the channel region 540*c*. The above example, in which the data storage structure 550 and the gate electrode 560 are modified to cover some side surfaces of the channel region 540*c*, will be described with reference to FIGS. 21 and 22.

Figure 21:
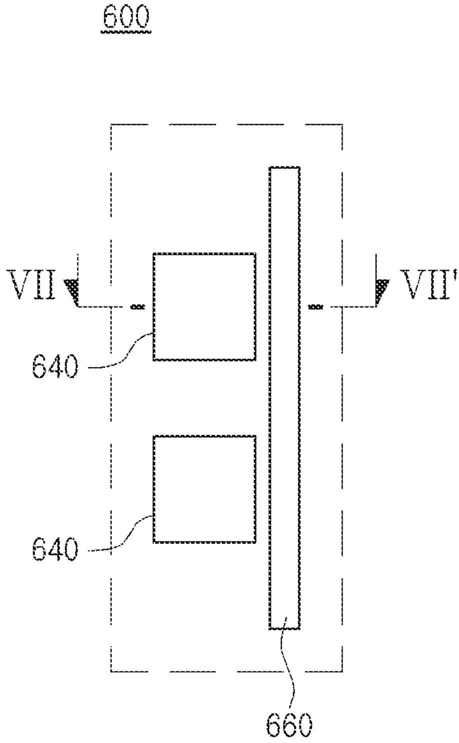
FIGS. 21 and 22 are views illustrating a modified example of a memory device according to an example embodiment.
Figure 22:
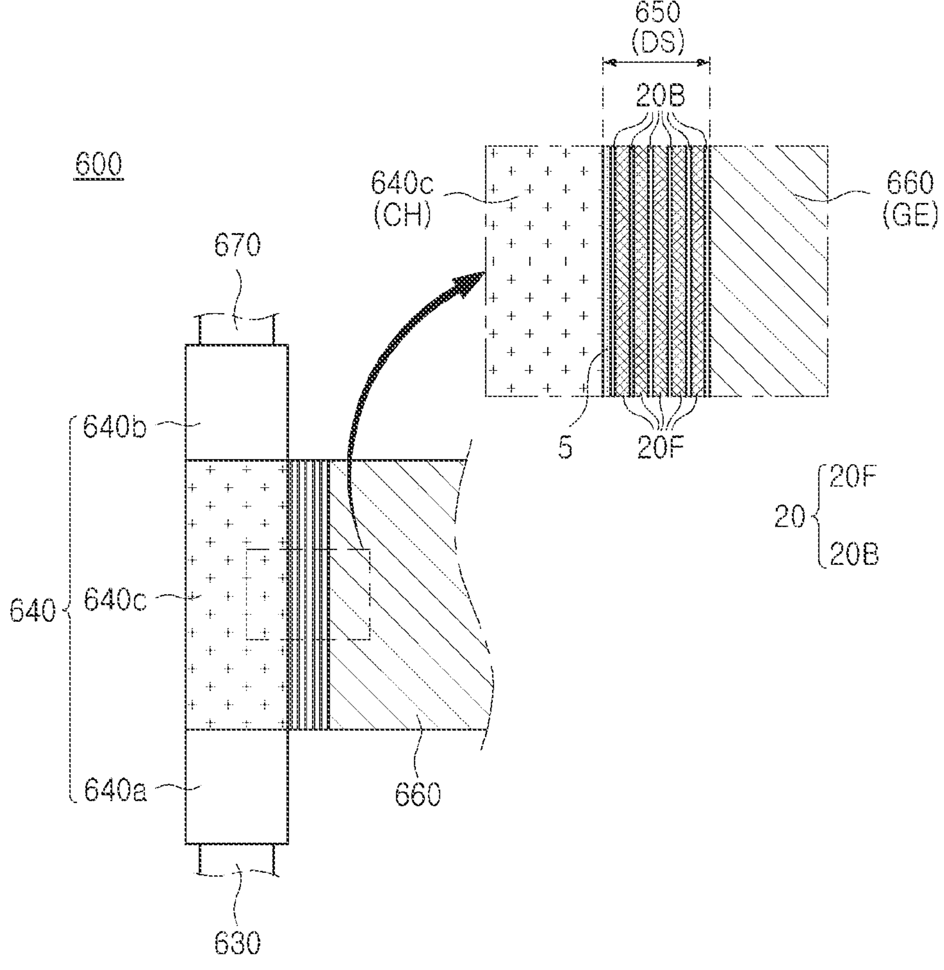

FIG. 21 is a plan view illustrating another example of a memory device according to an example embodiment, and FIG. 22 is a schematic cross-sectional view illustrating a portion of a region taken along VII-VII' of FIG. 21.

Referring to FIGS. 21 and 22, a memory device 600 according to an example embodiment may include a vertical semiconductor pattern 640, a gate electrode 660 extending while facing some side surfaces of the vertical semiconductor pattern 640, a first contact plug 630 below the vertical semiconductor pattern 640, a second contact plug 670 on the vertical semiconductor pattern 640, and a data storage structure 650 between the gate electrode 660 and the vertical semiconductor pattern 640.

The vertical semiconductor pattern 640 may include a lower source/drain 640*a*, an upper source/drain 640*b* on the lower source/drain 640*a*, and a channel region 640*c* between the lower source/drain 640*a* and the upper source/drain 640*b*.

The channel region 640*c* may be the channel region CH described with reference to FIGS. 1 to 7, and the gate electrode 660 may be the conductive electrode GE described with reference to FIGS. 1 to 7. The data storage structure 650 may be one of the data storage structures DS described with reference to FIGS. 1 to 7. For example, the data storage structure 650 may include the data storage structure DS as illustrated in FIG. 1 including, for example, the lower dielectric layer 5 and the stack structure 20. The lower dielectric layer 5 may contact the channel region (CH) 640*c*. The stack structure 20 may include the data storage layers 20F and the two-dimensional material layers 20B as described with reference to FIG. 1.

Figure 23:
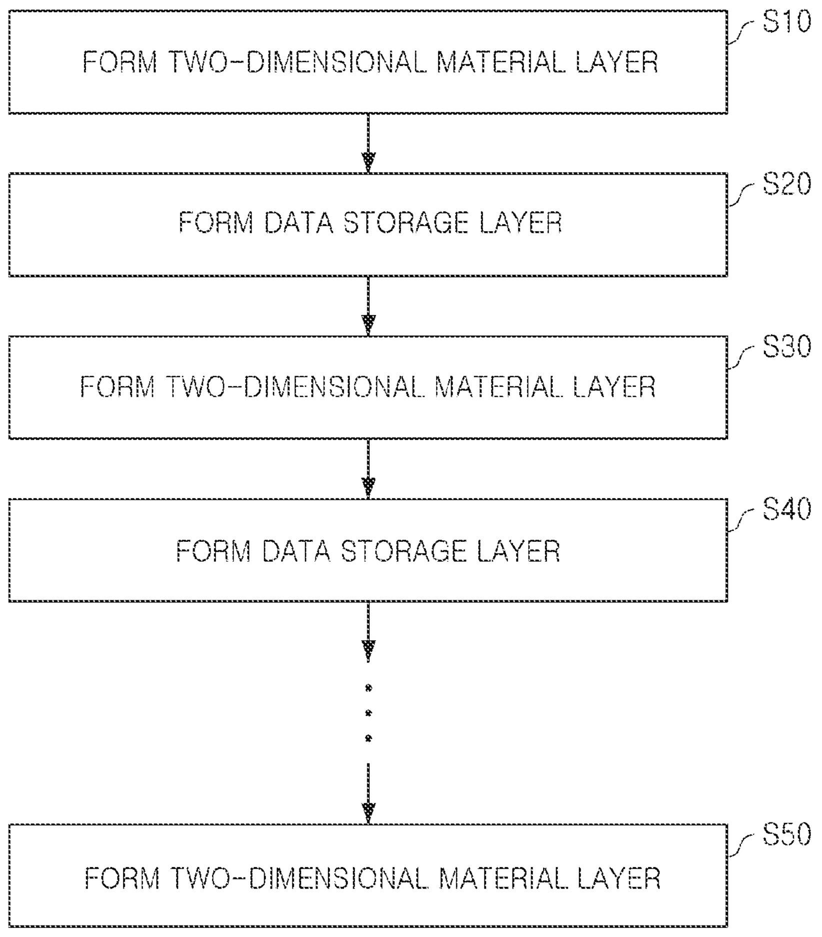
FIG. 23 is a flowchart illustrating an example of a method of fabricating a memory device according to an example embodiment.

Next, an example of a method of forming the data storage layers 20F and the two-dimensional material layers 20B of the data storage structure DS in the above-described embodiments will be described. FIG. 23 is a process flowchart illustrating an example of a method of forming the data storage layers 20F and the two-dimensional material layers 20B of the data storage structure DS in the above-described embodiments.

Referring to FIGS. 1 and 23, forming the data storage structure DS may include repeatedly performing forming a two-dimensional material layer (S10) and forming a data storage layer (S20). For example, forming a two-dimensional material layer (S10), forming a data storage layer (S20), forming a two-dimensional material layer (S30), and forming a data storage layer (S40) may be sequentially performed, and the forming the two-dimensional material layer (S10) and the forming the data storage layer (S20) may then be repeatedly performed until a desired thickness is obtained, and when an uppermost layer is a two-dimensional material layer, forming a two-dimensional material layer may be performed (S50). The data storage layer may be a ferroelectric layer. The two-dimensional material layer may be an insulating two-dimensional material such as h-BN.

As described above, a data storage structure, including two-dimensional material layers and ferroelectric layers alternately stacked, may be provided. Two-dimensional material layers, which may be stressors, may be inserted between the data storage layers to enhanced polarization of the data storage layers. Accordingly, reliability and durability of a memory device may be improved. The two-dimensional material layers, which may be stressor layers, may be inserted between the data storage layers to improve distribution characteristics of the memory device. The two-dimensional material layers may be inserted between the data storage layers and the data storage layers may be formed of a plurality of layers to improve a memory window and to implement multiple bits. As a result, performance of the memory device may be improved.

While example embodiments have been shown and described above, it will be apparent to those skilled in the art that modifications and variations could be made without departing from the scope of the present disclosure as defined by the appended claims.

What is claimed is:

1. A memory device comprising:

a channel region;

a conductive electrode on the channel region; and a data storage structure between the channel region and the conductive electrode, wherein the data storage structure includes a stack structure including two-dimensional material layers and ferroelectric layers stacked alternately and repeatedly in a direction perpendicular to a surface of the channel region, each of the two-dimensional material layers including hexagonal boron nitride (h-BN), and wherein a thickness of each of the ferroelectric layers is greater than a thickness of each of the two-dimensional material layers.

2. The memory device of claim 1, wherein the two-dimensional material layers include an insulating material.

3. The memory device of claim 1, wherein the data storage structure further includes a lower dielectric layer contacting the channel region, and wherein the stack structure is on the lower dielectric layer.

4. The memory device of claim 1, wherein an uppermost layer among the two-dimensional material layers and the ferroelectric layers is an uppermost one of the two-dimensional material layers.

5. The memory device of claim 1, wherein an uppermost layer among the two-dimensional material layers and the ferroelectric layers is an uppermost one of the ferroelectric layers.

6. The memory device of claim 1, wherein a lowermost layer among the two-dimensional material layers and the ferroelectric layers is a lowermost one of the two-dimensional material layers.

7. The memory device of claim 1, wherein a lowermost layer among the two-dimensional material layers and the ferroelectric layers is a lowermost one of the ferroelectric layers.

8. The memory device of claim 1, wherein the data storage structure further comprises:

a lower dielectric layer on the channel region; and a data storage layer between the lower dielectric layer and the stack structure.

9. The memory device of claim 1, further comprising:

a substrate; and a semiconductor pattern on the substrate, wherein the semiconductor pattern includes a first source/drain region in a lower region of the semiconductor pattern, a second source/drain region in an upper region of the semiconductor pattern, and the channel region in the semiconductor pattern between the first source/drain region and the second source/drain region, wherein the conductive electrode faces a side surface of the semiconductor pattern, and wherein the data storage structure is between the side surface of the semiconductor pattern and the conductive electrode.

10. The memory device of claim 1, further comprising:

a source region and a drain region spaced apart from each other, wherein the channel region is between the source region and the drain region, wherein the conductive electrode is on an upper surface of the channel region, a first side surface of the channel region, and a second side surface of the channel region, and wherein the first and second side surfaces of the channel region oppose each other.

11. The memory device of claim 1, further comprising:

a source region and a drain region on a substrate; and active layers between the source region and the drain region and spaced apart from each other in the direction, wherein each of the active layers includes the channel region, wherein the conductive electrode surrounds each of the active layers, and wherein the data storage structure is between the active layers and the conductive electrode.

12. The memory device of claim 1, further comprising:
a gate stack structure including interlayer insulating layers and gate electrodes alternately stacked in the direction; and
a vertical memory structure extending in the gate stack structure in the direction,
wherein the vertical memory structure comprises:
an insulating core pattern;
a channel layer on a side surface of the insulating core pattern;
the data storage structure on an external side surface of the channel layer; and
a pad pattern on the insulating core pattern,
wherein each of the gate electrodes includes the conductive electrode,
wherein the channel layer has regions facing the gate electrodes, and each of the regions of the channel layer facing the gate electrodes is the channel region, and
wherein the data storage structure continuously extends between the gate electrodes from a first level to a second level, the first level being lower than a level of a lowermost one of the gate electrodes and the second level being higher than a level of an uppermost one of the gate electrodes.

13. The memory device of claim 1, further comprising:
a first stack region and a second stack region; and
a vertical memory structure extending between the first stack region and the second stack region,
wherein the first stack region includes first interlayer insulating layers and first conductive lines stacked alternately and repeatedly in the direction,
wherein the second stack region includes second interlayer insulating layers and second conductive lines stacked alternately and repeatedly in the direction, and
wherein the vertical memory structure comprises:
ring patterns stacked while being spaced apart from each other in the direction; and a conductive structure extending in the ring patterns,
wherein each of the ring patterns includes the channel region and the data storage structure,
wherein the channel region surrounds a side surface of the conductive structure,
wherein the data storage structure is between the channel region and the conductive structure,
wherein the conductive structure includes one or more protrusions extending in the ring patterns, and
wherein the conductive structure is the conductive electrode.

14. A memory device comprising:
a channel region;
a conductive electrode facing the channel region; and
a data storage structure between the channel region and the conductive electrode,
wherein the data storage structure includes a stack structure including two-dimensional material layers and data storage layers stacked alternately and repeatedly in a direction perpendicular to a surface of the channel region,
wherein a thickness of each of the data storage layers in the direction is greater than a thickness of each of the two-dimensional material layers in the direction, and
wherein each of the two-dimensional material layers include hexagonal boron nitride (h-BN).

15. The memory device of claim 14, wherein the two-dimensional material layers include an insulating material.

16. The memory device of claim 14, wherein the data storage structure has a ring shape in plan view.

* * * * *